United States Patent
Makiyama

(10) Patent No.: US 10,366,914 B2
(45) Date of Patent: Jul. 30, 2019

(54) METHOD OF MANUFACTURING SEMICONDUCTOR DEVICE AND SEMICONDUCTOR DEVICE

(71) Applicant: RENESAS ELECTRONICS CORPORATION, Tokyo (JP)

(72) Inventor: Hideki Makiyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/861,363

(22) Filed: Jan. 3, 2018

(65) Prior Publication Data

US 2018/0247861 A1 Aug. 30, 2018

(30) Foreign Application Priority Data

Feb. 27, 2017 (JP) .................................. 2017-034702

(51) Int. Cl.
*H01L 21/762* (2006.01)
*H01L 29/66* (2006.01)
*H01L 21/311* (2006.01)
*H01L 29/78* (2006.01)
*H01L 21/8234* (2006.01)
*H01L 29/06* (2006.01)
(Continued)

(52) U.S. Cl.
CPC .. *H01L 21/76283* (2013.01); *H01L 21/31111* (2013.01); *H01L 21/76232* (2013.01); *H01L 21/823468* (2013.01); *H01L 21/84* (2013.01); *H01L 27/1203* (2013.01); *H01L 29/0653* (2013.01); *H01L 29/66628* (2013.01); *H01L 29/78* (2013.01); *H01L 21/823412* (2013.01); *H01L 21/823481* (2013.01); *H01L 29/665* (2013.01); *H01L 29/6656* (2013.01)

(58) Field of Classification Search
CPC ......... H01L 21/76283; H01L 21/76232; H01L 27/1203; H01L 29/78; H01L 29/0653; H01L 21/823481
See application file for complete search history.

(56) References Cited

U.S. PATENT DOCUMENTS

| 9,337,079 B2 | 5/2016 | Loubet et al. | |
| 2011/0233688 A1* | 9/2011 | Ren | H01L 21/84 |
| | | | 257/408 |

(Continued)

FOREIGN PATENT DOCUMENTS

| JP | 2014-078715 A | 5/2014 |
| JP | 2014-236097 A | 12/2014 |
| JP | 2015-103555 A | 6/2015 |

*Primary Examiner* — Sonya D. McCall-Shepard
(74) *Attorney, Agent, or Firm* — McDermott Will & Emery LLP

(57) ABSTRACT

In a manufacturing method for a semiconductor device formed over an SOI substrate, a first epitaxial layer is partially formed over an outer circumference end of a first semiconductor layer in a wide active region. Then, a second epitaxial layer is formed over each of the first semiconductor layers in a narrow active region and the wide active region. Thereby, a second semiconductor layer configured by a laminated body of the first semiconductor layer and the first and second epitaxial layers is formed in the wide active region and a third semiconductor layer configured by a laminated body of the first semiconductor layer and the second epitaxial layer is formed in the narrow active region.

10 Claims, 30 Drawing Sheets

(51) Int. Cl.
*H01L 27/12* (2006.01)
*H01L 21/84* (2006.01)

(56) References Cited

U.S. PATENT DOCUMENTS

| 2012/0056245 A1* | 3/2012 | Kang | H01L 21/0245 257/192 |
| 2014/0353756 A1 | 12/2014 | Yamamoto | |
| 2015/0137239 A1 | 5/2015 | Shinohara et al. | |

\* cited by examiner

METHOD OF MANUFACTURING SEMICONDUCTOR DEVICE AND SEMICONDUCTOR DEVICE

CROSS-REFERENCE TO RELATED APPLICATIONS

The disclosure of Japanese Patent Application No. 2017-034702 filed on Feb. 27, 2017 including the specification, drawings and abstract is incorporated herein by reference in its entirety.

BACKGROUND

The present invention relates to a technology pertaining to a semiconductor device manufacturing method and a semiconductor device and relates to, for example, the technology which is effectively applied to the technology pertaining to the semiconductor device manufacturing method and the semiconductor device that, for example, a field effect transistor is arranged on an SOI (Silicon On Insulator) substrate.

For example, in Japanese Unexamined Patent Application Publication No. 2014-236097, there is described a technology of making an outer circumference part of an epitaxial layer which is formed on a semiconductor layer of an SOI substrate overhang an upper face of an element isolation portion which is adjacent to the semiconductor layer.

In addition, for example, in Japanese Unexamined Patent Application Publication No. 2015-103555, there is described a technology of changing the thickness of an epitaxial layer formed on a semiconductor layer in accordance with the width of an active region formed in the semiconductor layer of an SOI substrate.

Still further, for example, in Japanese Unexamined Patent Application Publication No. 2014-078715, there is described a technology of forming an isolation trench in an SOI substrate, then forming a projection of a semiconductor layer which projects from a semiconductor layer which is exposed from a side face of the isolation trench toward the isolation trench by epitaxial growth and further forming raised source and drain on the semiconductor layer including the projection by the epitaxial growth

SUMMARY

Incidentally, in a field effect transistor which is formed on the SOI substrate, since the semiconductor layers in which the source and the drain are formed are thin, there are cases where, in formation of coupling holes in which plugs to be coupled to the source and the drain are to be formed, the coupling holes extend through the semiconductor layer and reach a support substrate. In addition, since the semiconductor layers in which the source and the drain are formed are thin, there are cases where resistances of the source and the drain are increased. Accordingly, as countermeasures against the above-described issues, in some cases, there is adopted a raised source and drain structure that the epitaxial layer is selectively grown on the semiconductor layers in which the source and the drain are formed in the active region and thereby the thicknesses of the semiconductor layers in which the source and the drain are formed are secured.

However, in a selective epitaxial growth process for formation of the raised source and drain structure, since the growth of the epitaxial layer is insufficient on an outer circumference end of an active region which is relatively wide in comparison with the growth of the epitaxial layer on a central part of the active region, the epitaxial layer is thinned and formed into an outward thinned and pointed shape. Therefore, for example, when the semiconductor device which is formed on the SOI substrate 1S in a standby state, electric field concentration occurs on a leading end of the epitaxial layer on the outer end portion of the wide active region and the TDDB (Time Dependent Dielectric Breakdown) lifetime of a buried insulating film of the SOI substrate 1S reduced.

Other matters to be solved and novel features of the present invention will become apparent from description of the specification and the appended drawings.

In a semiconductor device manufacturing method according to one embodiment, a first epitaxial layer is selectively formed only on/over an end of a semiconductor layer in an active region which is surrounded by an isolation portion of an SOI substrate and thereafter a second epitaxial layer is formed on/over the semiconductor layer in the whole active region of the SOI substrate.

In addition, in a semiconductor device according to one embodiment, an SOI substrate includes a first active region which is surrounded by an isolation portion and having a width whose length in a first direction is greater than or equal to a first length and a second active region which is surrounded by the isolation portion and having a width whose length in the first direction is less than the first length. On an outer circumference end of the epitaxial layer formed on/over each of the semiconductor layers in the first active region and the second active region, an angle formed between a boundary plane between a buried insulating film of the SOI substrate and the semiconductor layer and an inclined plane of the outer circumference end of the epitaxial layer is at least more than 30°.

According to one embodiment of the present invention, it is possible to improve the lifetime of the semiconductor device formed on/over the SOI substrate.

DETAILED DESCRIPTION

Figure 1:
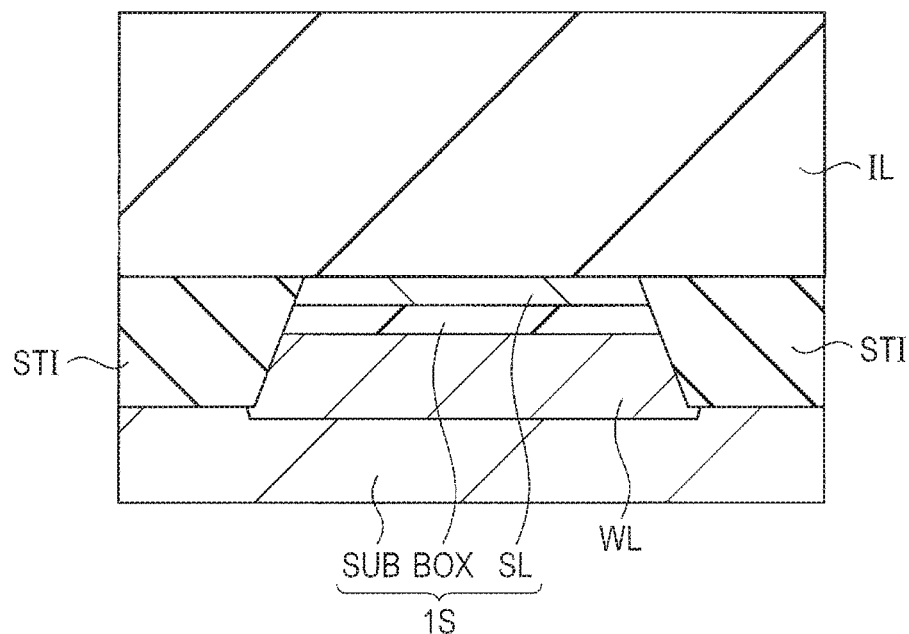
FIG. 1 is a sectional diagram illustrating one example of main parts of an SOI substrate.

Although, in the following embodiment, description will be made by dividing it into a plurality of sections or embodiments when necessary for convenience, these are not unrelated to each other or one another and these are related to each other or one another such that one covers some or all of modified examples, details, supplemental explanation and so forth of the other except where clearly stated in particular.

In addition, in the following embodiment, in a case where the number of constitutional elements and so forth (the number of units, a numerical value, an amount/a quantity, a range and so forth are included) is referred to, it is not limited to the specific number and may be either not less than the specific number or not more than the specific number except where clearly stated in particular and except where definitely limited to the specific number in principle and so forth.

Further, in the following embodiment, it goes without saying that the constitutional elements (element steps and so forth are also included) thereof are not necessarily essential except where clearly stated in particular and except where clearly thought to be essential in principle.

Likewise, in the following embodiment, when the shapes of the constitutional elements and so forth, a positional relationship between/among them and so forth are referred to, the ones which are substantially approximate to or similar to the shapes and so forth shall be included except where clearly stated in particular and except where clearly thought that they are not approximate or similar thereto in principle. The same is true of the above-mentioned numerical values and the ranges.

In addition, in all the drawings illustrated for description of the embodiments, the same numerals are assigned to the same members in principle and repetitive description thereof is omitted. Incidentally, there are cases where hatching is added even in a plan view for clear illustration of the drawings.

<Re: Issue Pertaining to Semiconductor Layer of SOI Substrate>

Refinement of field effect transistors is promoted on the basis of a scaling rule for achieving high-integration of semiconductor devices. However, in the refined field effect transistor, a short-channel effect and a threshold-voltage variation ordinarily occur and therefore a reduction in performance of the semiconductor device is induced. In this respect, ordinary occurrence of the short-channel effect and the threshold-voltage variation is seldom seen in the field effect transistor formed on the SOI substrate in comparison with a field effect transistor formed on a semiconductor substrate (a bulk substrate) and therefore the field effect transistor formed on the SOI substrate 1S excellent in performance of the semiconductor device. Accordingly, for example, in a semiconductor device developed after the generation that the circuit line width is about 90 nm, there are cases where the field effect transistor is formed on the SOI substrate.

In particular, a fully depleted transistor which is one example of the field effect transistor formed on the SOI substrate 1S highly excellent in the point that the short-channel effect is suppressed and is also excellent in the point that also the threshold voltage variation caused by a variation in impurities is sufficiently suppressed because no impurity is introduced into a channel region thereof. Accordingly, it is possible to provide a semiconductor device which is excellent in performance by adopting the fully depleted transistor.

Incidentally, the thickness of the semiconductor layer formed in the SOI substrate 1S more and more reduced with promotion of high-integration of the semiconductor devices. In particular, in the fully depleted transistor, it is necessary to fully deplete the semiconductor layer (a silicon layer) and therefore it is necessary to make the thickness of the semiconductor layer of the SOI substrate very thin. However, there are cases where a plug to be coupled to the semiconductor layer penetrates through the semiconductor layer and a buried insulating film and reaches a support substrate caused by thinning of the semiconductor layer of the SOI substrate in this way. In the following, this point will be described.

First, FIG. 1 is a sectional diagram illustrating one example of main parts of an SOI substrate 1S. The SOI substrate 1S includes a support substrate SUB, a buried insulating film BOX formed on/over the support substrate SUB, the semiconductor layer SL formed on/over the buried insulating film BOX and so forth. A trench-type element isolation portion STI is formed on/over a surface of the support substrate SUB. A well WL is formed in the support substrate SUB. Further, an interlayer insulating film IL which is configured by, for example, a silicon oxide film is formed on/over the SOI substrate 1S.

Figure 2:
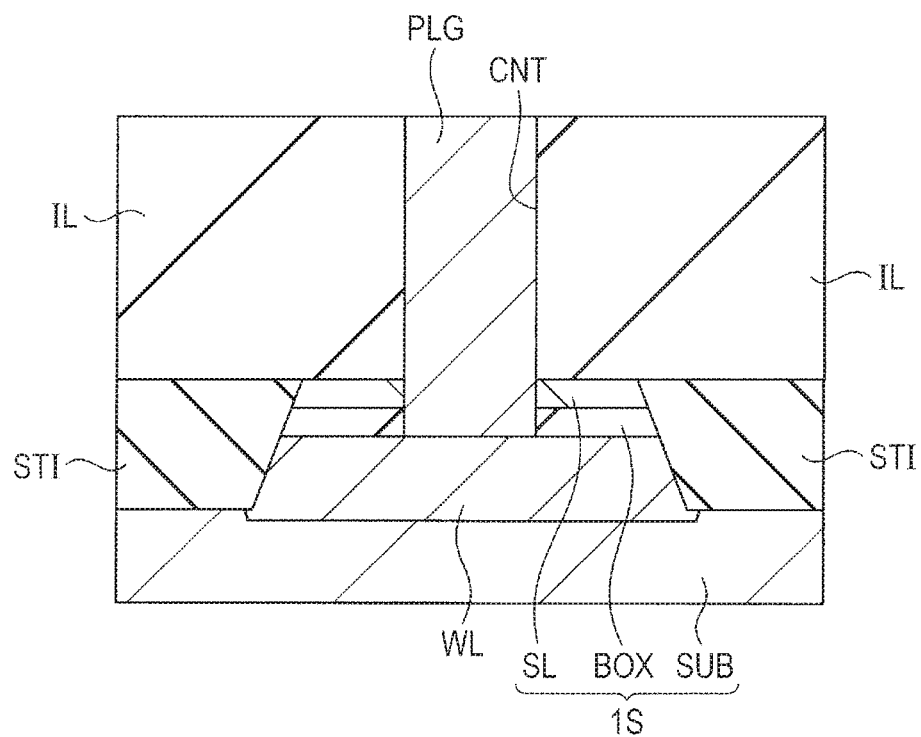
FIG. 2 is a sectional diagram illustrating one example of the main parts of the SOI substrate for the purpose of describing an issue which would occur in a case where a plug is formed in the SOI substrate in FIG. 1.

Then, FIG. 2 is a sectional diagram illustrating one example of the main parts of the SOI substrate for the purpose of describing an issue which would occur in a case where a plug PLG is formed in the SOI substrate 1S in FIG. 1. For formation of the plug PLG, it is necessary to form a contact hole CNT which reaches the semiconductor layer SL of the SOI substrate 1S in the interlayer insulating film IL by using a lithographic technology and an etching technology as the preliminary step of formation of the plug PLG.

In this case, since the interlayer insulating film IL is configured by the silicon oxide film and the semiconductor layer SL of the SOI substrate 1S is configured by a silicon layer, it is thought that the semiconductor layer SL serves as an etching stopper and therefore progress of etching for formation of the contact hole CNT is stopped at a time point that the semiconductor layer SL is exposed.

However, according to investigations made by the inventors of the present invention, in a case where the thickness of the semiconductor layer SL is thin, for example, as in a case of forming the fully depleted transistor on/over the SOI substrate 1S, there are cases where the semiconductor layer SL does not sufficiently function as the etching stopper and therefore the contact hole CNT penetrates through the semiconductor layer SL as illustrated in FIG. 2. Then, since the buried insulating film BOX which is formed under the semiconductor layer SL is configured by the silicon oxide film which is the same as that of the interlayer insulating film IL, the contact hole CNT penetrates through also the buried insulating film BOX. In particular, in a case where a configuration that a threshold voltage of the field effect transistor formed on the SOI substrate 1S is adjusted not only in accordance with a gate potential to be applied to a gate electrode but also in accordance with a back-gate potential to be applied to the well WL is adopted, it is necessary to thin the buried insulating film BOX and therefore it becomes easy for the contact hole CNT to penetrate through the buried insulating film BOX.

In a case where the contact hole CNT penetrates through the semiconductor layer SL and the buried insulating film BOX and reaches the support substrate SUB in this way, the semiconductor layer SL and the support substrate SUB (the well WL) are brought into conductive states via the plug PLG which is buried in the contact hole CNT. That is, the field effect transistor and the support substrate SUB are erroneously brought into the conductive states and thereby the field effect transistor does not operate normally.

<Re: Raised Source and Drain Structure>

Figure 3:
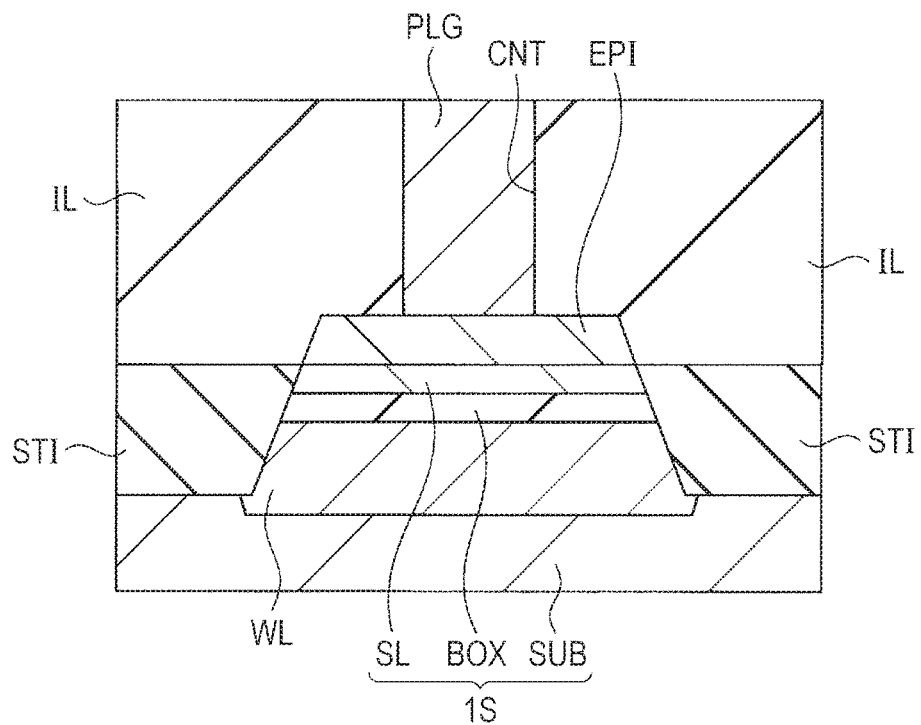
FIG. 3 is a sectional diagram illustrating one example of the main parts of the SOI substrate for the purpose of describing a raised source and drain structure.

As a configuration example for preventing occurrence of such an issue pertaining to the SOI substrate as described above, a raised source and drain structure is given. FIG. 3 is a sectional diagram illustrating one example of the main parts of the SOI substrate for the purpose of describing the raised source and drain structure. In this structure, the epitaxial layer EPI which is made of silicon is laminated on a source and drain formation region of the semiconductor layer SL of the SOI substrate 1S. In this case, since the thickness of part of the semiconductor layer SL to which the plug PLG is to be coupled reaches a thickness obtained by adding together thicknesses of the conductor layer SL and the epitaxial layer EPI, it becomes possible to make the semiconductor layer (the epitaxial layer EPI and the semiconductor layer SL) formed under the plug PLG sufficiently function as the etching stopper in formation of the contact hole CNT. Accordingly, it is possible to prevent occurrence of the above-described erroneous conduction between the semiconductor layer SL and the support substrate SUB and it is possible to prevent occurrence of a malfunction of the field effect transistor.

<Re: Issue Caused by Off-Position>

Figure 4:
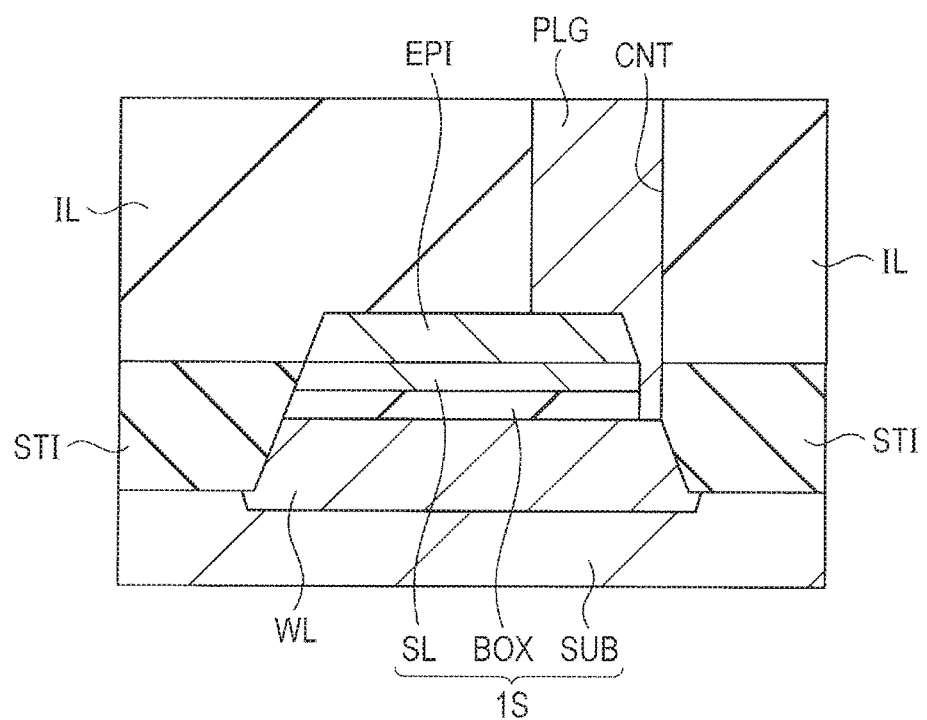
FIG. 4 is a sectional diagram illustrating one example of the main parts of the SOI substrate for the purpose of describing an issue caused by off-position of the plug in the raised source and drain structure.

Incidentally, as illustrated in FIG. 3, there exists room for improvement which will be described in the following in a structure that the epitaxial layer EPI is formed only on/over the semiconductor layer SL. FIG. 4 is a sectional diagram illustrating one example of the main parts of the SOI substrate for the purpose of describing the issue caused by off-position of the plug in the raised source and drain structure. Here, a case where the position of the plug PL which is formed in the interlayer insulating film IL is shifted to the element isolation portion STI side is supposed.

A tapered "facet" structure is formed on an end of the epitaxial layer EPI which is formed on/over the semiconductor layer SL of the SOI substrate by an epitaxial growth method. That is, the thickness of the end of the epitaxial layer is gradually reduced as the epitaxial layer approaches the element isolation portion STI. Therefore, in a case where the position of the contact hole CNT to be formed in the interlayer insulating film IL is shifted to the element isolation portion STI side, the contact hole CNT is formed in a part having the "facet structure" which is thinned in the epitaxial layer EPI. In this case, since the epitaxial layer CNT is thinned on the part of the "facet structure", the above-described semiconductor layer (the epitaxial layer EPI and the semiconductor layer SL) does not sufficiently function as the etching stopper in formation of the contact hole CNT. That is, the contact hole CNT penetrates through the semiconductor layer SL and the buried insulating film BOX and reaches the support substrate SUB. As a result, the semiconductor layer SL and the support substrate SUB are erroneously brought into the conductive states via the plug PLG irrespective of adoption of the raised source and drain structure.

Figure 5:
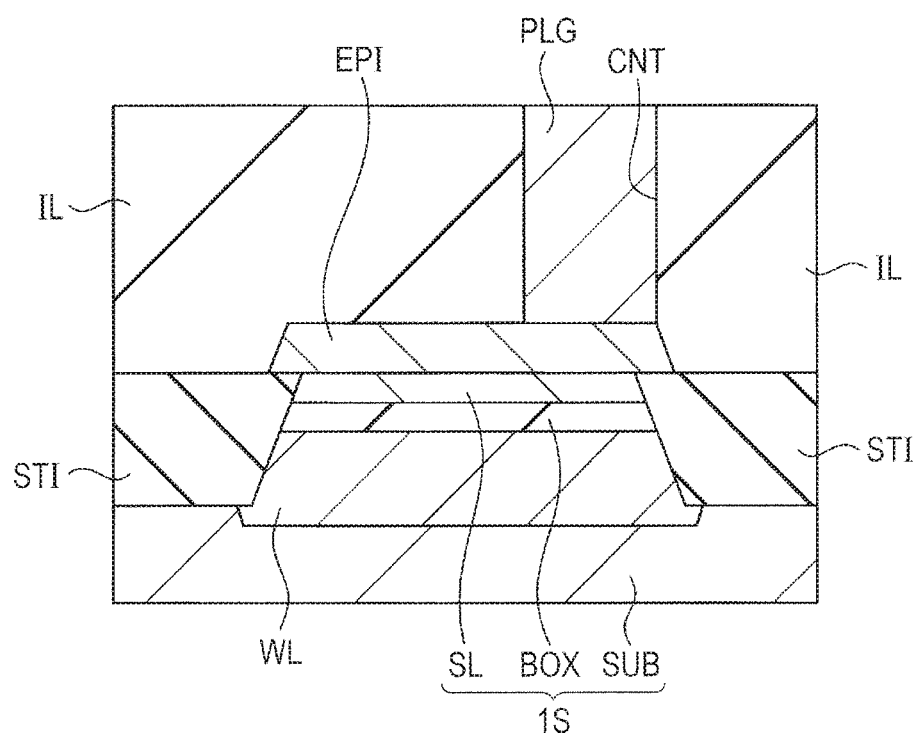
FIG. 5 is a sectional diagram illustrating one example of the main parts of the SOI substrate for the purpose of describing one example of remedial measures against the issue pertaining to the raised source and drain structure.

Here, FIG. 5 is a sectional diagram illustrating one example of the main parts of the SOI substrate for the purpose of describing one example of remedial measures against the issue pertaining to the raised source and drain structure. In this case, the epitaxial layer EPI is formed to cover not only over the semiconductor layer SL but also over part of the element isolation portion STI beyond a boundary between the semiconductor layer SL and the element isolation portion STI. That is, the "facet structure" of the end of the epitaxial layer EPI is not formed on/over the semiconductor layer SL and is formed on/over the element isolation portion STI. Accordingly, it is possible to sufficiently secure the film thickness obtained by adding the thicknesses of the semiconductor layer SL and the epitaxial layer EPI together also on the end of the semiconductor layer SL which is located close to the element isolation portion STI. That is, even in a case where the formation position of the contact hole CNT is shifted toward the element isolation portion STI side, it is possible for the semiconductor layer (the semiconductor layer SL and the epitaxial layer EPI) on the end of the semiconductor layer SL to sufficiently exhibit the function as the etching stopper in formation of the contact hole CNT. Therefore, even in the case where the formation position of the contact hole CNT is shifted toward the element isolation portion STI side, it is possible to prevent occurrence of the erroneous conduction that the semiconductor layer SL and the support substrate SUB are erroneously brought into the conductive states via the plug PLG and therefore it is possible to prevent occurrence of the malfunction of the field effect transistor.

<Novel Knowledge that Inventors of the Present Invention have Found>

As described above, it is thought that prevention of penetration of the plug PLG toward the support substrate SUB side is possible in addition to prevention of shifting of the formation position of the contact hole CNT toward the element isolation portion STI side by adopting the structure (see FIG. 5) that the epitaxial layer EPI is formed to cover not only over the semiconductor layer SL but also over the part of the element isolation portion STI. That is, it is thought that it is possible to prevent occurrence of the malfunction of the field effect transistor caused by the erroneous conduction between the semiconductor layer SL and the support substrate SUB via the plug PLG.

However, the inventors of the present invention have found novel knowledge that in a case where the formation position of the contact hole CNT is shifted toward the element isolation portion STI side, there are cases where it is not necessarily possible to prevent occurrence of the erroneous conduction between the semiconductor layer SL and the support substrate SUB via the plug PLG irrespective of adoption of the structure illustrated in FIG. 5. In the following, the novel knowledge that the inventors of the present invention have found will be described.

First, as a precondition of description of the novel knowledge that the inventors of the present invention have found, there exist active regions of various sizes which are partitioned by the element isolation portion STI on the SOI substrate 1S. That is, although an SRAM, a logic circuit, an I/O circuit and so forth are formed on a semiconductor chip, the sizes of the active regions in which these circuits are formed are mutually different depending on the kind of the circuit used. Accordingly, there exist the active regions of various sizes which correspond to various circuits on the SOI substrate 1S which configures the semiconductor chip. In the following the novel knowledge that the inventors of the present invention have found will be described under the above-described precondition.

Figure 6:
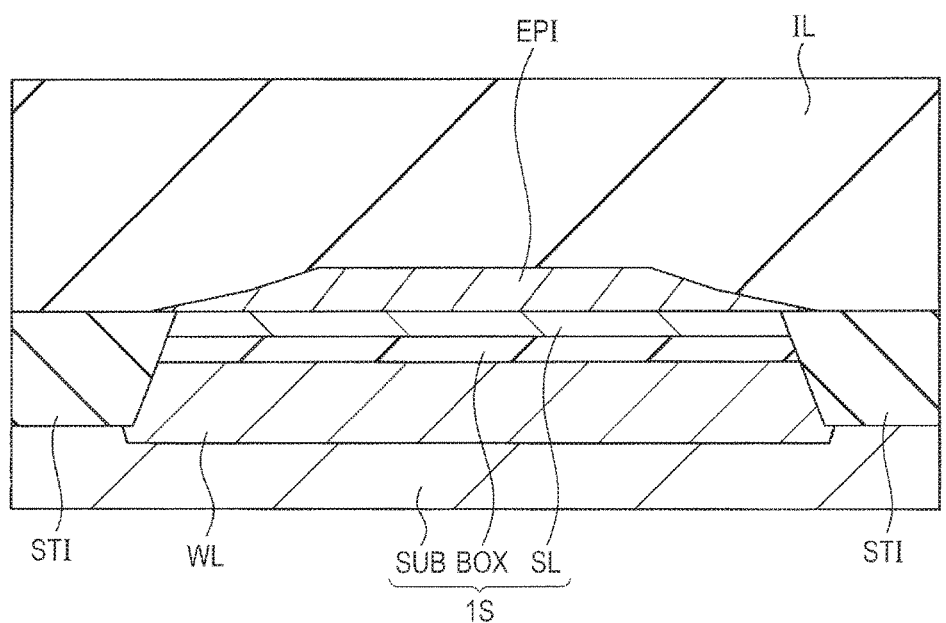
FIG. 6 is a sectional diagram illustrating one example of the main parts of the SOI substrate for the purpose of describing knowledge that the inventors of the present invention have newly found.

FIG. 6 is a sectional diagram illustrating one example of the main parts of the SOI substrate for the purpose of describing the novel knowledge that the inventors of the present invention have found. The element isolation portion STI and the well WL are formed in the SOI substrate 1S which includes the support substrate SUB, the buried insulating film BOX and the semiconductor layer SL. Then, the epitaxial layer EPI is formed on/over the semiconductor layer SL in a state of extending from above the semiconductor layer SL to above the part of the element isolation portion STI. Although the configuration which has been described so far is the same as the above-described configuration in FIG. 5, in case of the configuration illustrated in FIG. 6, the structure of the end of the epitaxial layer EPI has a "trailing structure". That is, the configuration in FIG. 6 is different from the configuration in FIG. 5 in that while the structure of the end of the epitaxial layer EPI has the "facet structure" in FIG. 5, the structure of the end of the epitaxial layer EPI has the "trailing structure" in FIG. 6.

Here, the "facet structure" illustrated in FIG. 5 means a tapered shape and particularly means an end shape which is configured by a steeply inclined line. On the other hand, the "trailing structure" illustrated in FIG. 6 means an end shape formed by combining a steely inclined line with a gently inclined line. That is, the "trailing structure" illustrated in FIG. 6 is different from the "facet structure" which has the end shape configured by the inclined line having a constant inclination and is illustrated in FIG. 5 in the point that the "trailing structure" is configured by combining the inclined lines of different inclinations with each other or one another. In particular, as a feature of the "trailing structure", a point that a width (in a gate width direction) of the "trailing structure" becomes greater than a width (in the gate width direction) of the "facet structure" may be given.

In the "facet structure", it is possible to prevent occurrence of the erroneous conduction between the semiconductor layer SL and the support substrate SUB via the plug PLG irrespective of shifting of the formation position of the contact hole CNT toward the element isolation portion STI side by adopting the configuration illustrated in FIG. 5. On the other hand, in the "trailing structure", in a case where the formation position of the contact hole CNT is shifted toward the element isolation portion STI side, the semiconductor layer SL and the support substrate SUB are erroneously brought into the conductive states via the plug PLG irrespective of adoption of the configuration illustrated in FIG. 5 because of the above-described feature of the "trailing structure".

In the following, the above-described point will be described. As described above, the inventors of the present invention have found that the end shape of the epitaxial layer EPI formed on/over the semiconductor layer SL in the active region differs depending on the width of the active region surrounded by the element isolation portion STI under the precondition that there exist the active regions of various sizes which correspond to the various circuits in the semiconductor chip.

Specifically, the knowledge is as follows. That is, in a case where the width (the width in the gate width direction) of the active region concerned is small, the end shape of the epitaxial layer EPI which is formed on/over the semiconductor layer SL in the active region exhibits the "facet structure" as illustrated in FIG. 5. On the other hand, in a case where the width (the width in the gate width direction) of the active region concerned is large, the end shape of the epitaxial layer EPI which is formed on/over the semiconductor layer SL in the active region exhibits the "trailing structure" as illustrated in FIG. 6.

Then, when taking this knowledge into consideration, in a case where the width of the active region is small as illustrated in FIG. 5, it is possible to prevent penetration of the contact hole CNY through the semiconductor layer SL and the buried insulating film BOX irrespective of shifting of the formation position of the contact hole CNT toward the element isolation portion STI side. Therefore, it is possible to prevent occurrence of the erroneous conduction between the semiconductor layer SL and the support substrate SUB via the plug PLG.

Figure 7:
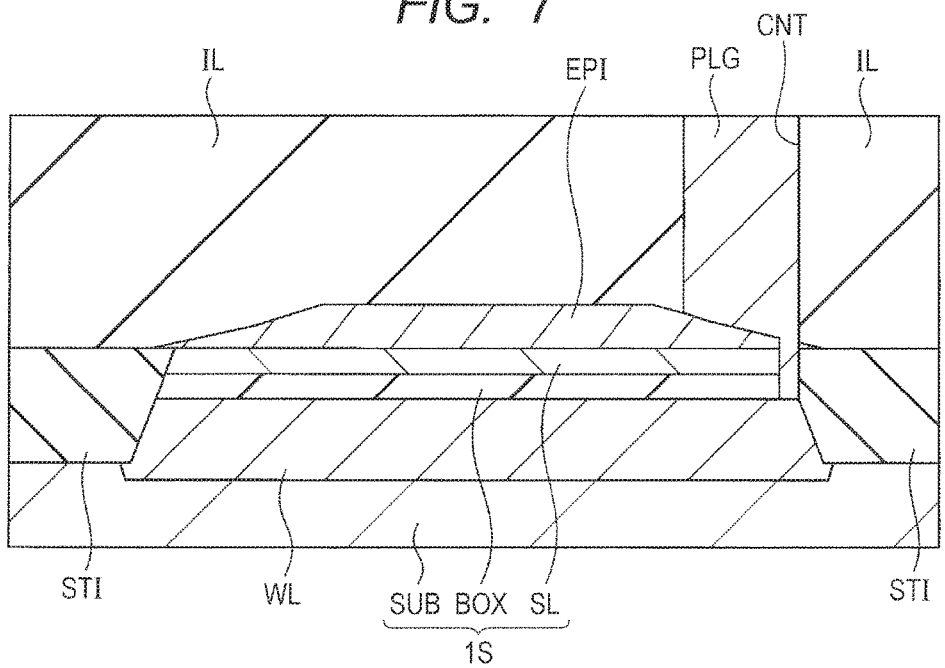
FIG. 7 is a sectional diagram illustrating one example of the main parts of the SOI substrate for the purpose of describing the issue caused by off-position of the plug in the case in FIG. 6.

On the other hand, FIG. 7 is a sectional diagram illustrating one example of the main parts of the SOI substrate for the purpose of describing the issue caused by off-position of the plug in the case illustrated in FIG. 6. As illustrated in FIG. 6 and FIG. 7, in a case where the width (the width in the gate width direction) of the active region is large, when the formation position of the contact hole CNT is shifted toward the element isolation portion STI side, the contact hole CNT is formed in the end of the epitaxial layer EPI having the "trailing structure". Since the epitaxial layer EPI is thinned on the place having the "training structure", the semiconductor layer (the semiconductor layer SL and the epitaxial layer EPI) does not sufficiently function as the etching stopper in formation of the contact hole CNT. As a result, even in a case where the epitaxial layer EPI is formed on/over the semiconductor layer SL in a state of extending from above the semiconductor layer SL and overhanging the part of the element isolation portion STI as illustrated in FIG. 7, when the formation position of the contact hole CNT is shifted toward the element isolation portion STI side, penetration of the contact hole CNT through the semiconductor layer SL and the buried insulating film BOX occurs and the semiconductor layer SL and the support substrate SUB are erroneously brought into the conductive states via the plug PLG.

<Details of Knowledge>

The novel knowledge that the inventors of the present invention have found is such that the end shape of the epitaxial layer EP formed on/over the semiconductor layer SL in the active region concerned differs depending on the width (the width in the gate width direction) of the active region surrounded by the element isolation portion STI. Qualitatively, the novel knowledge that the inventors of the present invention have found is such that while in a case where the width of the active region concerned is small, the end shape of the epitaxial layer EPI exhibits the "facet structure", in a case where the width of the active region is large, the end shape of the epitaxial layer EPI exhibits the "trailing structure".

Figure 8A:
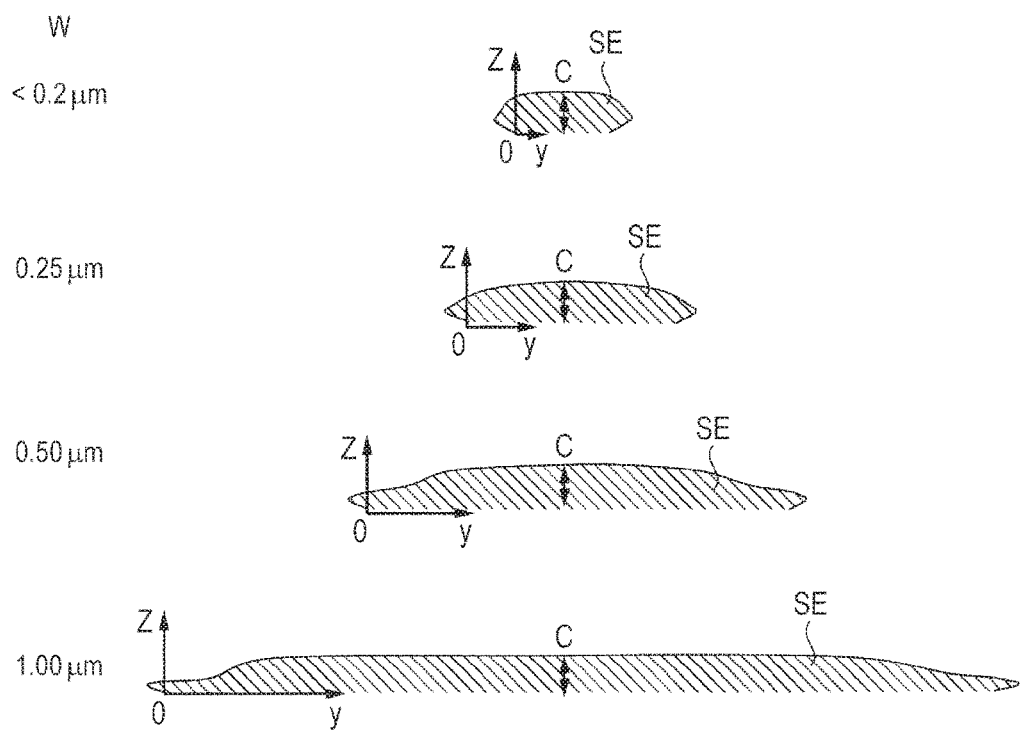
FIG. 8A is a diagram schematically illustrating one example of a change in shape of a semiconductor layer SE (a semiconductor layer SL and an epitaxial layer EP1) in a case where a width (a gate width direction) of an active region is changed.
Figure 8B:
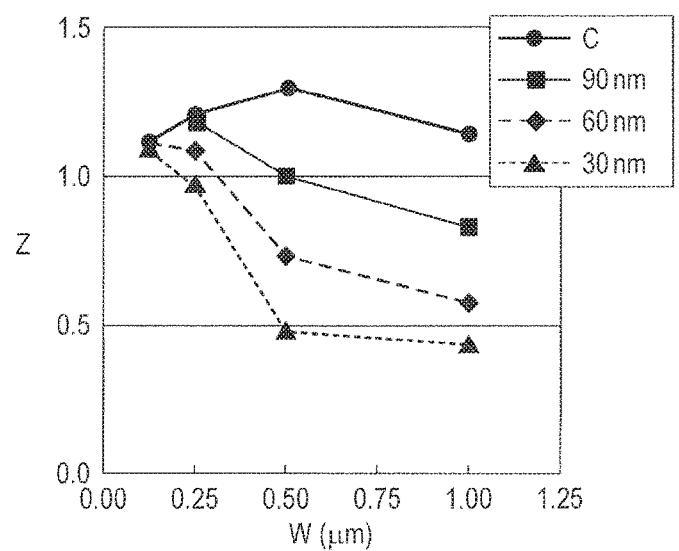
FIG. 8B is a graph illustrating one example of a relation between a width (W) of the active region and a thickness of the semiconductor layer SE (the semiconductor layer SL and the epitaxial layer EP1).

In the following, details of the novel knowledge that the inventors of the present invention have found will be specifically described with reference to FIG. 8A and FIG. 8B. FIG. 8A is a diagram schematically illustrating one example of a change in shape of the semiconductor layer SE (the semiconductor layer SL and the epitaxial layer EPI) in a case where the width (the width W in the gate width direction) of the active region is changed and FIG. 8B is a graph illustrating one example of a relation between the width (the width W in the gate width direction) of the active region and a thickness of the semiconductor layer SE (the semiconductor layer SL and the epitaxial layer EPI). Incidentally, "Z" denotes a height (here, a thickness of the semiconductor layer SE configured by combining the semiconductor layer SL with the epitaxial layer EPI) in a direction which is vertical to the principal surface of the SOI substrate 1S, "y" denotes a position separated from a boundary between the element isolation portion STI and the active region and "C" denotes a central position of the width W in the gate width direction of the semiconductor layer SE.

First, in FIG. 8A, it is seen that in a case where the width W of the active region is less than or equal to 0.2 μm, the end shape of the semiconductor layer SE exhibits the "facet structure". It is seen that in a case where the width W of the active region is increased to 0.25 μm, the end shape of the semiconductor layer SE exhibits a "facet structure" which is gentler than the "facet structure" exhibited when the width W of the active region is less than or equal to 0.2 μm. Further, it is seen that in a case where the width W of the active region is increased to 0.5 μm, the end shape of the semiconductor layer SE exhibits the "trailing stricture" and in a case where the width W of the active region is increased to 1.0 μm, the end shape of the semiconductor layer SE exhibits a more "trailing structure". Accordingly, when taking the result in FIG. 8A into consideration, it is seen that in a case where the width W of the active region is less than or equal to 0.25 μm, the end shape of the semiconductor layer SE generally exhibits the "facet structure" and in a case where the width W of the active region exceeds about 0.25 μm, the end shape of the semiconductor layer SE exhibits the "trailing structure". That is, when qualitatively evaluating the novel knowledge that the inventors of the present invention have found from the result in FIG. 8A, it may be said that the end shape is changed from the "facet structure" to the "trailing structure" bordering on a case where the width W of the active region is about 0.25 μm. Accordingly, in a case where the width W of the active region is less than or equal to 0.25 μm, it is possible to suppress penetration of the contact hole CNT through the semiconductor layer SL and the buried insulating film BOX irrespective of shifting of the formation position of the contact hole CNT toward the element isolation portion STI side by adopting the configuration illustrated in FIG. 5. Thereby, it is possible to prevent occurrence of the erroneous conduction between the semiconductor layer SL and the support substrate SUB via the plug PLG.

On the other hand, when the width W of the active region is greater than 0.25 μm, in a case where the formation position of the contact hole CNT is shifted toward the element isolation portion Si side, it becomes difficult to effectively prevent penetration of the contact hole CNT through the semiconductor layer SL and the buried insulating film BOX irrespective of adoption of the configuration illustrated in FIG. 5. Accordingly, there is a possibility that the erroneous conduction between the semiconductor layer SL and the support substrate SUB via the plug PGL may occur. Therefore, it is seen that when the width W of the active region is greater than 0.25 μm, it is necessary to adopt a contrivance which is replaced with the configuration illustrated in FIG. 5 for prevention of penetration of the contact hole CNT through the semiconductor layer SL and the buried insulating film BOX.

Then, in FIG. 8B, a horizontal axis indicates the width (in the gate width direction: W μm) of the active region and a vertical axis indicates a thickness ratio of the semiconductor layer SE. Incidentally, the thickness of the semiconductor layer SE described here is indicated as a value obtained by adding the thickness of the semiconductor layer SL of the SOI substrate 1S substrate 1S and the thickness of the epitaxial layer EPI together. In addition, in FIG. 8B, a "circle" indicates a thickness of the semiconductor layer SE measured at the center of the epitaxial layer EPI. In addition, a "square" indicates a thickness of the semiconductor layer SE measured at a position which is spaced away from a boundary between the support substrate SUB and the element isolation portion STI by 90 nm. In addition, a "rhombus" indicates a thickness of the semiconductor layer SE measured at a position which is spaced away from the boundary between the support substrate SUB and the element isolation portion STI by 60 nm. In addition, a "triangle" indicates a thickness of the semiconductor layer SE measured at a position which is spaced away from the boundary between the support substrate SUB and the element isolation portion STI by 30 nm.

As apparent from FIG. 8B, in a case where the width W of the active region is less than 0.25 μm, the "circle", the "square", the "rhombus" and the triangle" almost overlap one another. This means that the thickness of the central part of the semiconductor layer SE is almost equal to the thicknesses of the semiconductor layer SE measured at the positions which are spaced away from the boundary between the support substrate SUB and the element isolation portion STI by 30 nm to 90 nm.

On the other hand, as the width W of the active region is gradually increased from 0.25 μm, the "circle", the "square", the "rhombus" and the triangle" are gradually separated from one another. This means that the thickness of the semiconductor layer SE is decreased as going away from the center position of the semiconductor layer SE and approaching the position of the boundary between the support substrate SUB and the element isolation portion STI. In other words, it means that when the width W of the active region exceeds 25 μm, the "trailing structure" is ordinarily exhibited. It is seen that particularly when the width W of the active region reaches 1.0 μm, the thickness of the semiconductor layer SE measured at the position which is separated from the boundary between the support substrate SUB and the element isolation portion STI by 30 nm becomes thinner than a half of the thickness measured at the center position of the semiconductor layer SE. From this fact, it is seen that the more the width W of the active region is increased, the more ordinarily the "trailing structure" is exhibited. That is, the graph in FIG. 8B indicates that in a case where the formation position of the contact hole CNT is shifted toward the element isolation portion STI side, the more the width W of the active region is increased, the more frequently penetration of the contact hole CNT through the semiconductor layer SL and the buried insulating film BOX occurs.

Then, a result that the inventors of the present invention have investigated about the mechanism that when the width W of the active region is increased, the end shape of the epitaxial layer EPI is changed from the "facet structure" to the "trailing structure" will be described.

<Mechanism of Formation of "Trailing Structure">

Figure 9:
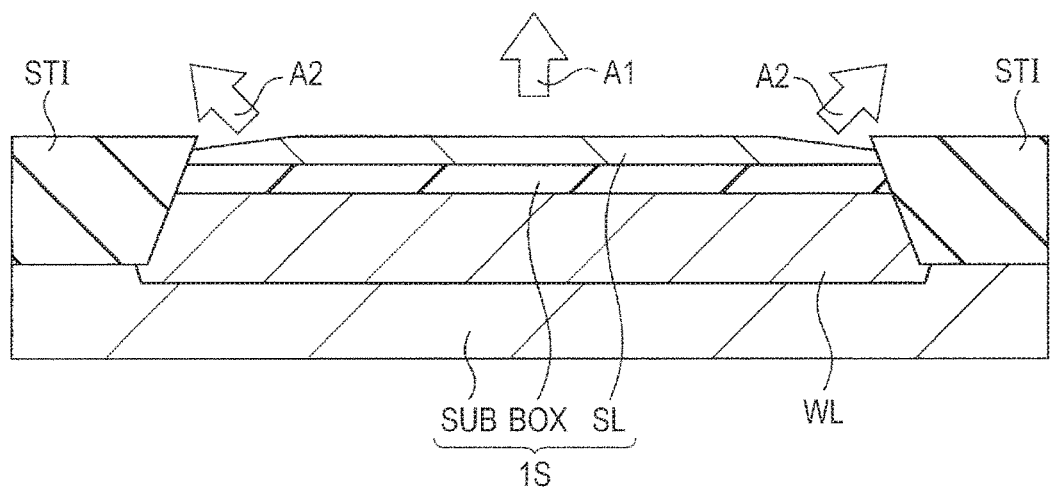
FIG. 9 is a sectional diagram illustrating one example of the main parts of the SOI substrate, illustrating a growth surface when the epitaxial layer is grown on/over the semiconductor layer of the SOI substrate by using an epitaxial growth method.

FIG. 9 is a diagram illustrating one example of a growth surface when the epitaxial layer is grown on/over the semiconductor layer SL of the SOI substrate 1S substrate 1S by using the epitaxial growth method. The epitaxial layer is grown along a (100) surface over the central part of the semiconductor layer SL as indicated by an arrow A1 in FIG. 9. This is because the surface of the semiconductor layer SL which underlies the epitaxial layer is the (100) surface and the epitaxial layer is grown on/over the (100) surface of the semiconductor layer SL.

On the other hand, the epitaxial layer is grown along a high-index surface which is represented by, for example, a (111) surface over the end and its vicinity of the semiconductor layer SL as indicated by an arrow A2 in FIG. 9. This is because the end of the semiconductor SL is rounded or inclined in such a manner that the film thickness of the semiconductor layer SL is thinned, for example, as schematically illustrated in FIG. 9 and the high-index surface which is different from the (100) surface is exposed as an inclined plane, and therefore the epitaxial layer is grown on/over the high-index surface on the end and its vicinity of the semiconductor layer SL.

Incidentally, the reason why the end of the semiconductor layer SL is formed into the rounded shape or the inclined shape is that the shape of the end of the semiconductor layer SL is formed to change with ease in a process of oxidizing the semiconductor layer SL to an oxide film and a process of removing the oxide film which are performed before formation of the epitaxial layer. For example, in a case where the element isolation portion STI is formed in a state of being depressed lower than the surface of the semiconductor layer SL, each side face of the semiconductor layer SL is exposed and therefore the shape of the end of the semiconductor layer SL is more liable to be influenced by such processes as described above. That is, the shape of the end of the semiconductor layer SL is formed into the rounded shape and the inclined shape caused by the fact that the shape of the end of the semiconductor layer SL is more liable to be influenced by such processes (the oxidizing process and the oxide film removing process) as described above than the shape of the central part of the semiconductor layer SL.

As described above, the central part and its vicinity and the end and its vicinity of the semiconductor layer SL are different from each other in orientation of the exposed face of the semiconductor layer SL which underlies the epitaxial layer. Then, the inventors of the present invention have newly found that the "trailing structure" is formed caused by a difference between the orientation of the growth face of the epitaxial layer on the central part and its vicinity of the semiconductor layer SL and the orientation of the growth face of the epitaxial layer on the end and its vicinity of the semiconductor layer SL.

Specifically, there exist many parts called "steps" and many parts called "kinks" in the epitaxial layer that the (100) surface is used as the growth face. These parts are mainly configured by dangling bonds of silicon. On the other hand, the number of the parts called the "steps" and the number of the parts called the "kinks" are small in the epitaxial layer that the high-index surface is used as the growth face. Then, the "trailing structure" is formed caused by the fact that while there exist many parts called the "steps" and many parts called the "kinks" on the (100) surface, there exist few parts called the "steps" and few parts called the "kinks" on the high-index surface.

In the following, a mechanism that the "trailing structure" is formed depending on the difference in number of the parts called the "steps" and the parts called the "kinks" between the (100) surface and the high-index surface will be described.

Figure 10:
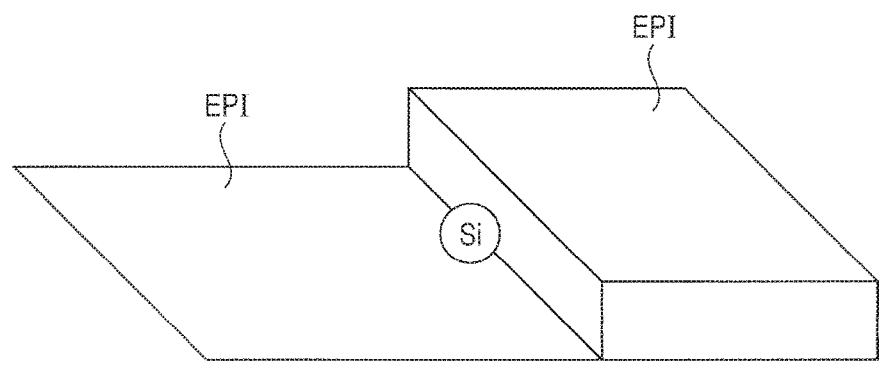
FIG. 10 is a diagram schematically illustrating one example of a shape of a "step".
Figure 11:
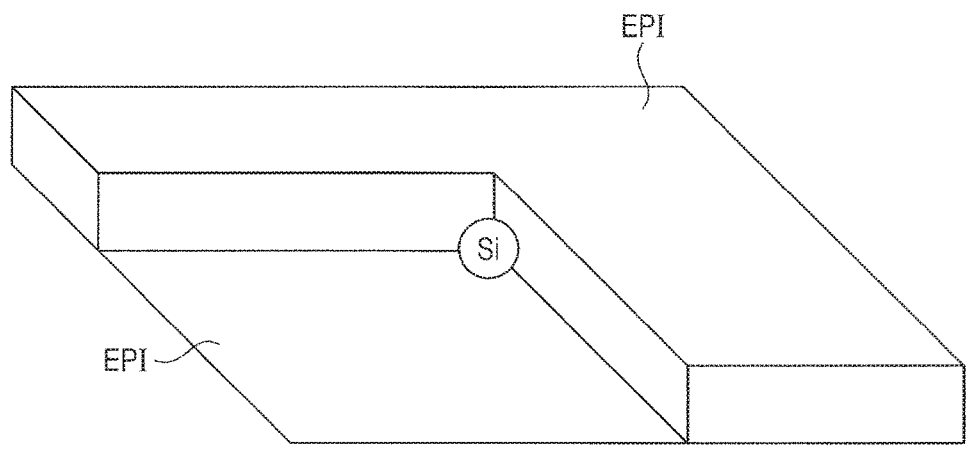
FIG. 11 is a diagram schematically illustrating one example of a shape of a "kink".

FIG. 10 is a diagram schematically illustrating one example of the shape of the "step" and a state where the silicon element is captured in the "step" is illustrated in FIG. 10. In addition, FIG. 11 is a diagram schematically illustrating one example of the shape of the "kink" and a state where the silicon element is captured in the "kink" is illustrated in FIG. 11. That is, as apparent from FIG. 10 and FIG. 11, the silicon element which forms a nucleus of epitaxial growth is captured in the "step" and the "kink" with ease. This means that the silicon element is captured with ease and there exist many nucleuses of epitaxial growth on the (100) surface having many "steps" and "kinks". For this reason, it is thought that a speed of epitaxial growth on the (100) surface is increased. On the other hand, capturing of the silicone element is difficult on the high-indel surface having few "steps" and "kinks" and this means that the number of the nucleuses for epitaxial growth is few on the high-index surface. For this reason, it is thought that the speed of the epitaxial growth on the high-index surface is decreased.

Figure 12:
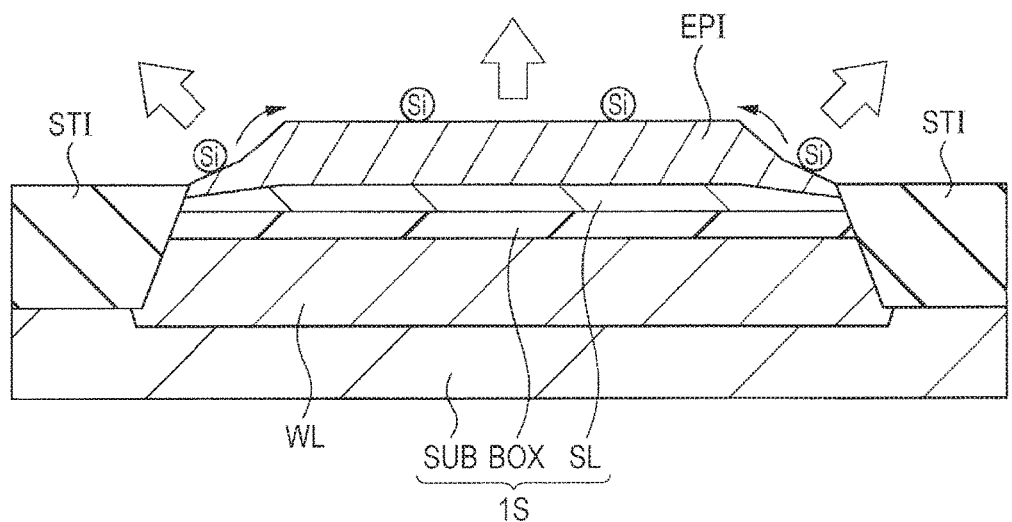
FIG. 12 is a sectional diagram illustrating one example of the main parts of the SOI substrate for the purpose of describing a mechanism that a "trailing structure" is formed.
Figure 13:
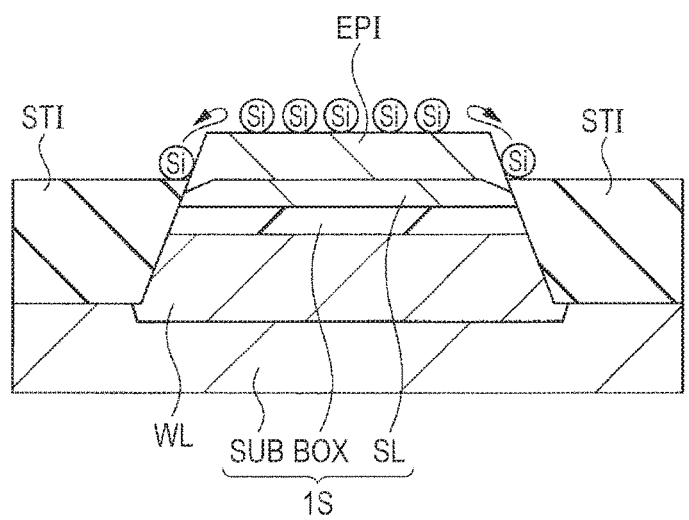
FIG. 13 is a sectional diagram illustrating one example of the main parts of the SOI substrate for the purpose of describing a mechanism that a "facet structure" is formed.

Further, as illustrated in FIG. 12, since the number of the "steps" and the number of the "kinks" are few on the high-index surface which is present on the end and its vicinity of the semiconductor layer SL, migration of the silicon elements adhered to the high-index surface occurs with ease. On the other hand, on the (100) surface on the central part of the semiconductor layer SL, the silicon elements which migrate from the high-index surface are captured with ease in the "steps" and "kinks" which are numerously present on the (100) surface. As a result, since the speed of the epitaxial growth is increased on the central region where the epitaxial layer is grown along the (100) surface, the thickness of the epitaxial layer is increased. In contrast, since the number of the "steps" and the number of the "kinks" which are parts for capturing the silicon elements are few on the end region and its vicinity of the semiconductor layer SL where the epitaxial layer is grown along the high-index surface, migration of the silicon elements from the end and its vicinity to the central part of the semiconductor layer SL occurs with ease. For this reason, the speed of the epitaxial growth is decreased and the thickness of the epitaxial layer is decreased on the end and its vicinity of the semiconductor layer SL.

The "trailing structure" is formed on the end and its vicinity of the epitaxial layer on the basis of the above-described mechanism. In particular, since as the width of the active region is increased, the ratio of the (100) surfaces to the high-index surfaces is increased, the number of the "steps" and the number of the "kinks" which are present on the (100) surface are increased naturally. Therefore, since the silicon elements which migrate from the high-index surface are surely captured in the "steps" and the "kinks" which are present on the (100) surface, it is thought that the possibility that the silicon elements may migrate from the (100) surface again to the high index surface is low. Therefore, it is thought that when the width of the active region is increased, formation of the "trailing structure" on the end and its vicinity of the epitaxial layer becomes easy. On the other hand, when the width of the active region is decreased, the ratio of the (100) surfaces to the high-index surfaces is decreased. Therefore, the number of the "steps" and the number of the "kinks" which are present on the (100) surface are decreased naturally. Consequently, it is thought that the silicon elements which migrate from the high-index surface to the (100) surface are not wholly captured in the "steps" and the "kinks" present on the (100) surface and overflow. Then, the silicon elements which overflow without being captured migrate from the (100) surface again to the high-index surface. Accordingly, a reduction in width of the active region leads to presence of many silicon elements which serve as the nucleuses of the epitaxial growth also on the high-index surface and formation of the "trailing structure" on the end and vicinity of the epitaxial layer becomes difficult. It is possible to explain a trend (see FIG. 8A) that while, for example, in a case where the width of the active region is small, formation of the "trailing structure" is difficult, the more the width of the active region is increased, the more ordinarily the "trailing structure" is exhibited on the basis of the above-described mechanism (see FIG. 8A).

<Issue Pertaining to "Trailing Structure">

Then, the inventors of the present invention have found a new issue pertaining to the above-described "trailing structure". The issue will be described with reference to FIG. 14 to FIG. 16.

Figure 14:
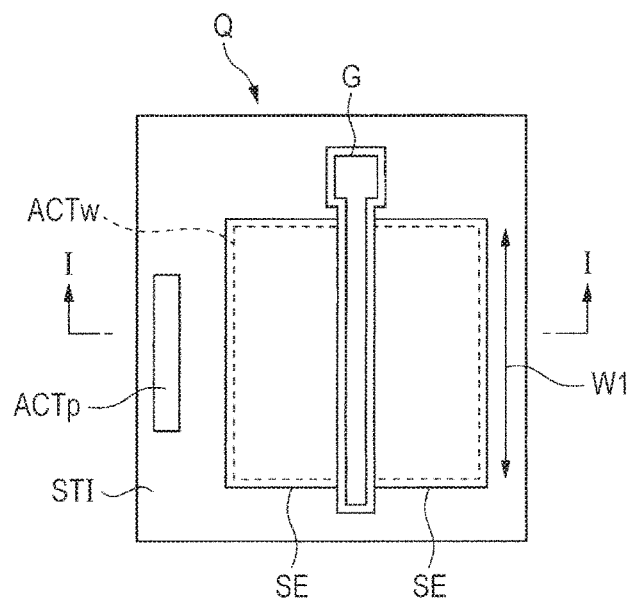
FIG. 14 is a plan view illustrating one example of a field effect transistor formed on/over the SOI substrate.
Figure 15:
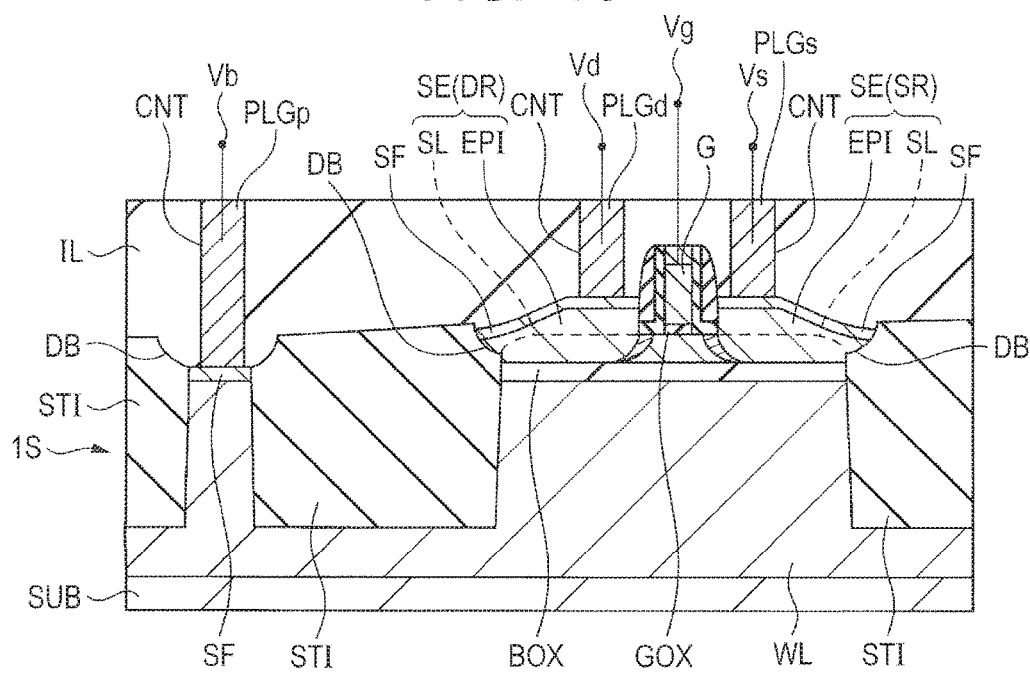
FIG. 15 is a sectional diagram along the I-I line in FIG. 14.

First, FIG. 14 is a plan view illustrating one example of a field effect transistor formed on the SOI substrate and FIG. 15 is a sectional diagram along the I-I line in FIG. 14. Incidentally, in FIG. 15, since the sectional diagram along the gate width direction is almost the same as that in FIG. 6 and therefore illustration thereof is omitted.

As illustrated in FIG. 14, a field effect transistor Q is arranged in a wide active region ACTw that a width W1 in the gate width direction is at least 0.25 μm. A gate electrode G of the field effect transistor Q is arranged on a center part in a channel length direction which is orthogonal to the gate width direction in the active region ACTw in a state of extending in the gate width direction to stride over the active region ACTw. The gate electrode G is formed on/over the semiconductor layer SL via a gate insulating film GOX as illustrated in FIG. 15.

In addition, as illustrated in FIG. 14, the semiconductor layers SE are arranged on both sides of the gate electrode G with the gate electrode G being interposed in the active region ACTw. The semiconductor layers SE are each formed by laminating the epitaxial layer EPI on/over the semiconductor layer SL as illustrated in FIG. 15. A source region SR and a drain region DR of the field effect transistor Q are formed in the respective semiconductor layers SE. An outer circumference end of each semiconductor layer SE projects into a depression DB formed in an outer circumference end of the element isolation portion STI. In this case, the shape of the outer circumference end of each semiconductor layer SL is formed into a "hemming structure" illustrated in FIG. 15.

Silicide layers SF are formed on/over upper faces of the gate electrode G and the semiconductor layers SE (the source region and the drain region). The silicide layers SF formed on/over the drain region DR and the source region SR are electrically coupled with plugs PLGd and PLGs respectively. The plugs PLGd and PLGs are formed in the contact holes CNT pierced in the interlayer insulating film IL.

In addition, an active region ACTp for power supply to the well WL is arranged at a position which is separated from the active region ACTw. The silicide layer SF is formed over an upper face of the support substrate SUB in the active region ACTp. The silicide layer SF is electrically coupled with the well WL and a plug PLGp. The plug PLGp is formed in the contact hole CNT pierced in the interlayer insulating film IL.

Incidentally, as described above, the field effect transistor Q is arranged in the active region ACTw that the width W1 in the gate width direction is at least 0.25 μm. Therefore, in a selective epitaxial growth process performed in formation of the epitaxial layer EPI, since growth of the epitaxial layer EPI is insufficient on an outer circumference end of the wide active region ACTw in comparison with the growth on a central part of the wide active region ACTw, the epitaxial layer EPI is thinned and is formed into an outward thinned and pointed shape (the hemming structure) on the outer circumference end of the active region ACTw. Therefore, for example, in a semiconductor device and so forth having a configuration that a threshold voltage of the field effect transistor Q is adjusted by applying a back-gate voltage Vb to the well WL of the SOI substrate 1S, electric field concentration occurs on a leading end part of the epitaxial layer EPI (the semiconductor layer SE) on the outer circumference end of the wide active region ACTw.

Incidentally, in FIG. 15, Vb, Vd, Vg and Vs denote voltages applied in the standby state of the semiconductor device. Vb is the back-gate voltage of, for example, −1.5 V, Vd is a drain voltage of, for example, 0.75 V, Vg is a gate voltage of, for example, 0 V and Vs is a source voltage of, for example, 0 V.

Figure 16:
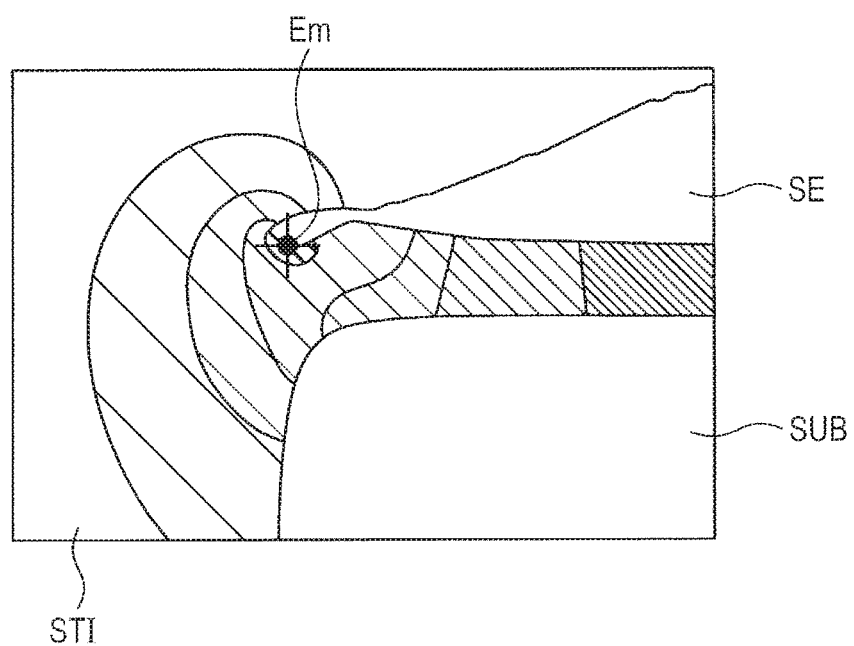
FIG. 16 is a diagram illustrating one example of a result of simulation of an electric field state of a boundary part between an element isolation portion and the semiconductor layer and the vicinity thereof in a wide active region when a semiconductor device in FIG. 14 is in a standby state.

Here, FIG. 16 illustrate one example of a result of simulation of an electric field state on a boundary part between the element isolation portion STI and the semiconductor layer SE and the vicinity thereof in the wide active region ACTw in the standby state of the semiconductor device in FIG. 14. It is illustrated that the finer hatching is, the more intense the electric field is. Em denotes an electric field maximum point. It is seen from this drawing that the electric field concentration occurs on the outer circumference end of the epitaxial layer EPI (the semiconductor layer SE). Therefore, the TDDB (Time Dependent Dielectric Breakdown) lifetime of the buried insulating film BOX of the SOI substrate 1S substrate 1S is shortened. This is because, for example, in the semiconductor device formed on the SOI substrate 1S substrate 1S, since the buried insulating film BOX is thicker than the gate insulating film GOX, a higher substrate bias voltage (the back-gate voltage) is applied in order to increase the threshold value of the field effect transistor Q in the standby state of the semiconductor device and so forth.

From the above-described viewpoint, in the present embodiment, a technology for solving the issue caused by the above-described "hemming structure" will be described.

Example of Semiconductor Device Manufacturing Method

One example of a manufacturing method of the semiconductor device according to the present embodiment will be described in accordance with a chart in FIG. 17 and with reference to FIG. 18 to FIG. 33. Incidentally, in the following drawings, hatching is made also on a plan view for clear illustration of the drawings.

Figure 18:
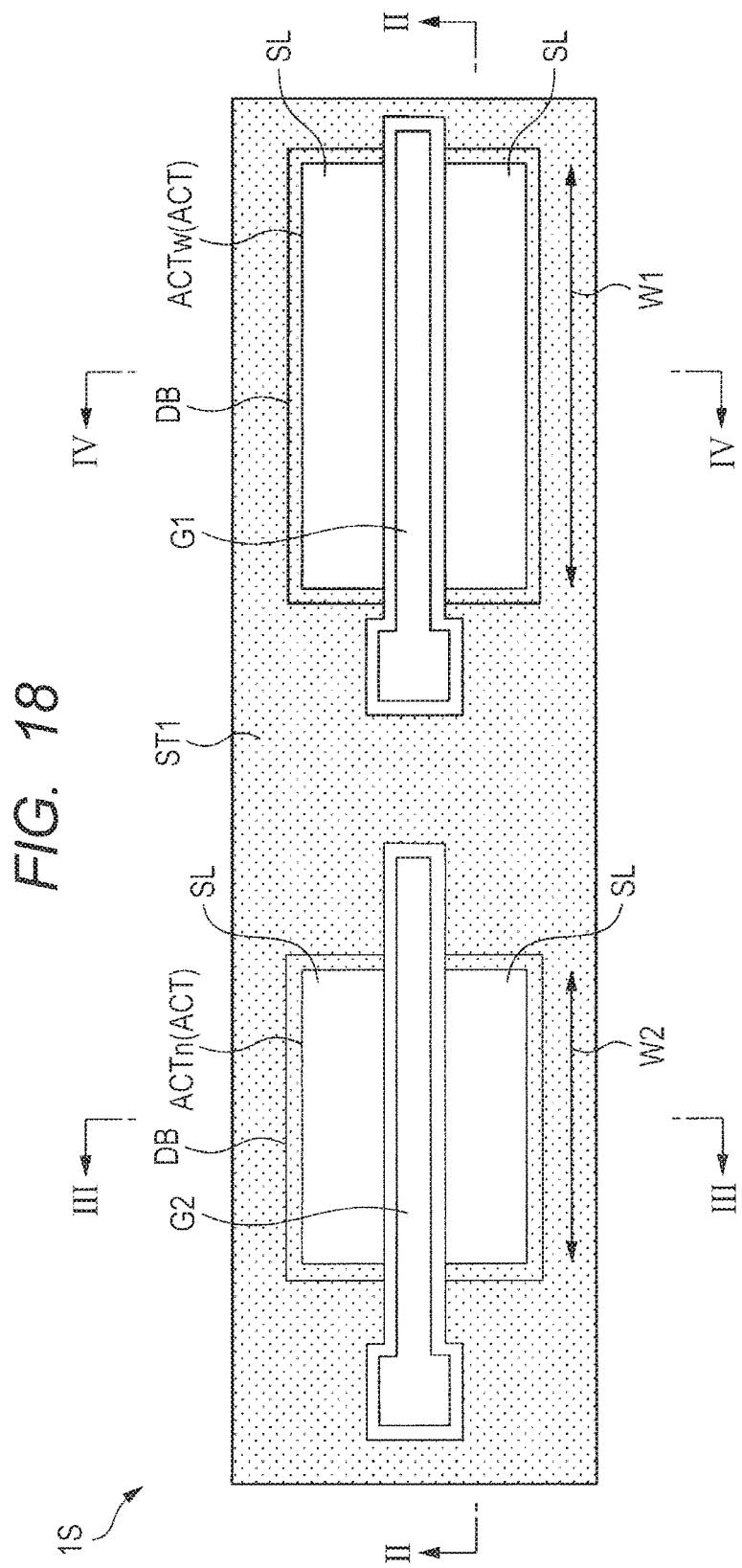
FIG. 18 is a plan view illustrating one example of main parts on a principal plane of the SOI substrate in one process of the manufacturing method of the semiconductor device according to the present invention.
Figure 19:
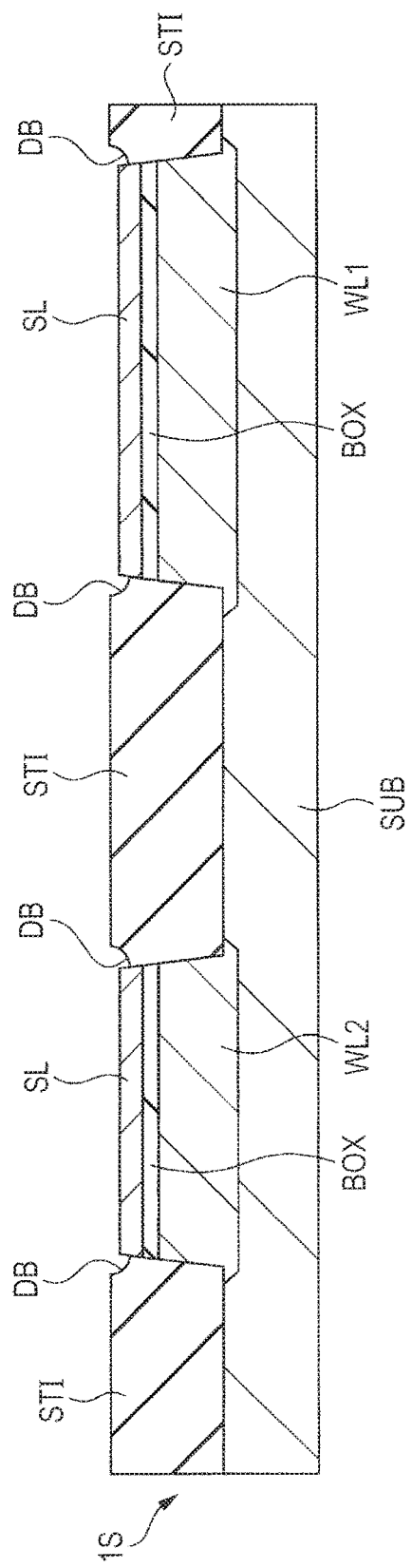
FIG. 19 is a sectional diagram along the II-II line in FIG. 18.
Figure 20:
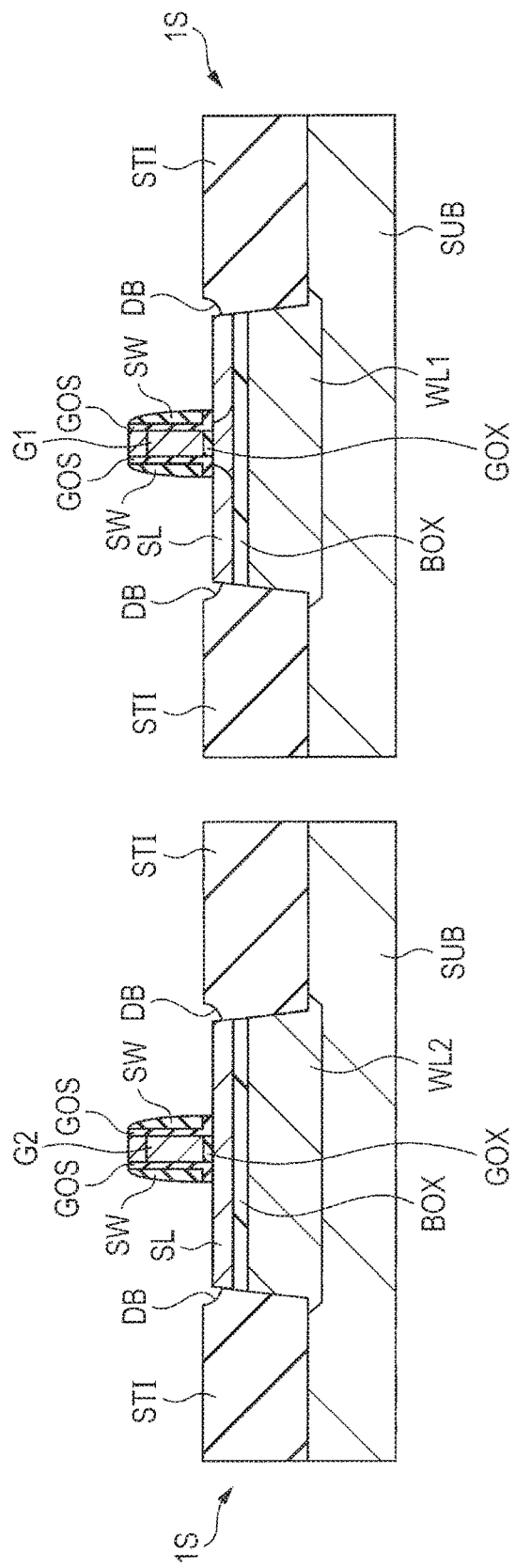
FIG. 20 is left-side and right-side sectional diagrams along the III-III line and the IV-IV line in FIG. 18 respectively.

FIG. 18 is a plan view illustrating one example of main parts on a principal surface of the SOI substrate in one process of the method of manufacturing the semiconductor device according to the present embodiment, FIG. 19 is a sectional diagram along the II-II line in FIG. 18 and FIG. 20 is left-side and right-side sectional diagrams along the III-III line and the IV-IV line in FIG. 18 respectively.

The SOI substrate 1S substrate 1S includes the support substrate SUB, the buried insulating film BOX formed on/over the support substrate SUB, the semiconductor layer SL formed on/over the buried insulating film BOX and so forth. The support substrate SUB is made of, for example, monocrystalline silicon (Si). The semiconductor layer SL is made of, for example, silicon (Si) and a thickness thereof is, for example, about 5 nm to about 20 nm. The buried insulating film BOX is made of, for example, silicon oxide and a thickness thereof is, for example, about 5 nm to about 20 nm.

Figure 17:
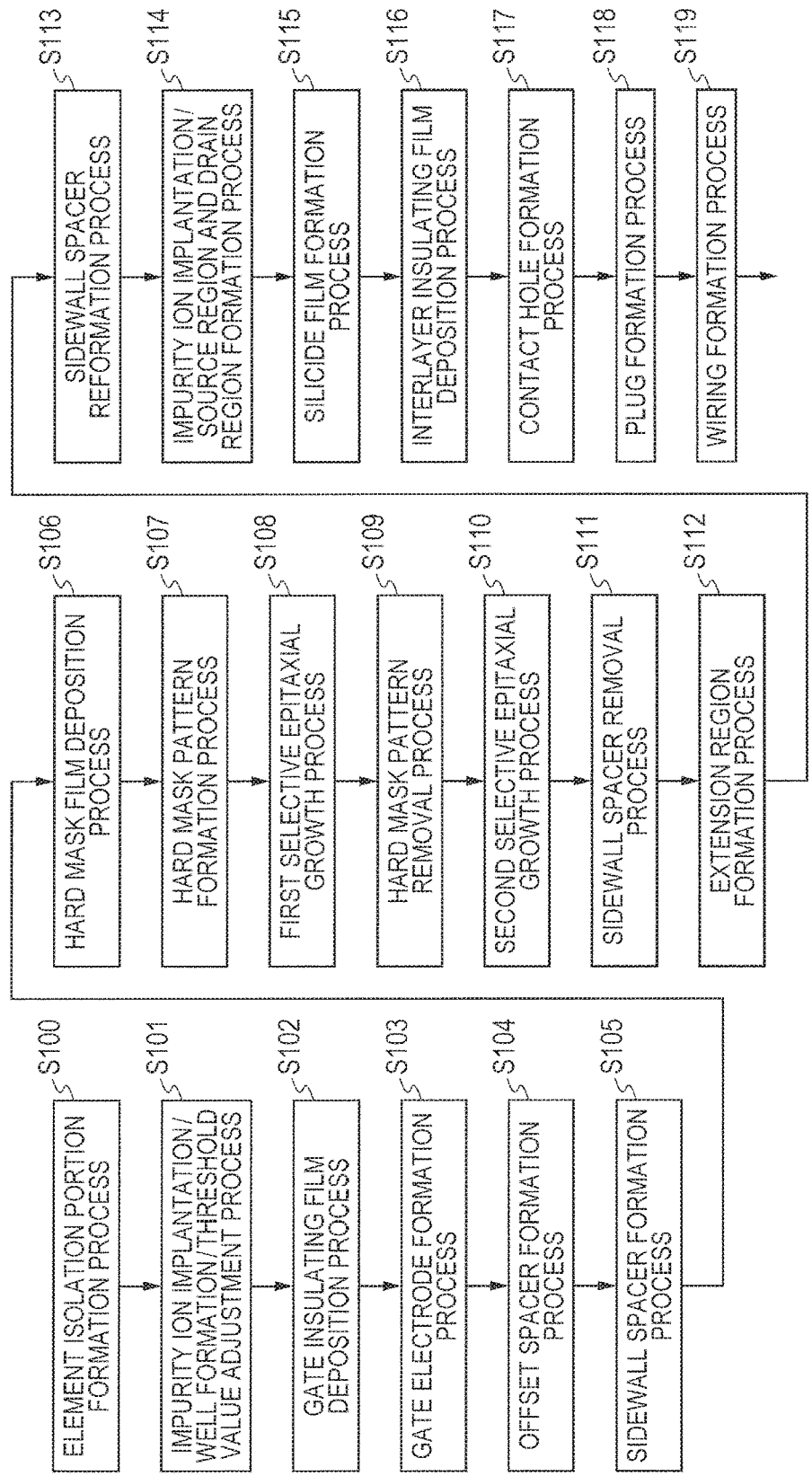
FIG. 17 is a process chart illustrating one example of a process flow of a manufacturing method of the semiconductor device according to one embodiment of the present invention.

First, the trench-type element isolation portion STI is formed in the SOI substrate 1S substrate 1S (S100 in FIG. 17). Thereby, the plurality of active regions ACT (ACTw, ACTn) which are partitioned by the element isolation portion STI are formed. At this time, also the active region ACTp for power supply is formed simultaneously with formation of the active regions ACTw and ACTn.

Here, the active region (a first active region) ACTw that the width W1 in the gate width direction (a first direction, an extending direction of the gate electrode) is at least 0.25 μm (250 nm: a first length) is representatively illustrated and the active region (a second active region) ACTn that a width W2 in the gate width direction is less than 0.25 μm is representatively illustrated. Incidentally, on most part including the central part of the surface of the semiconductor layer SL in the active regions ACT (ACTw and ACTn), the (100) surface is exposed. On the other hand, the end of the surface of the semiconductor layer SL in the active regions ACT (ACTw and ACTn) is inclined and the high-index surface which is different from the (100) surface is exposed as the inclined face.

Then, wells WL1 and WL2 are formed by implanting conductivity type impurities into the support substrate SUB of the SOI substrate 1S substrate 1S by an ion implantation method and so forth. In addition, the threshold value of the field effect transistor is adjusted by introducing the conductivity type impurities into the semiconductor layer SL of the SOI substrate 1S substrate 1S by the ion implantation method and so forth (S101 in FIG. 17).

Then, the gate insulating film GOX is formed on/over the semiconductor layer SL (S102 in FIG. 17). Then, a polysilicon film is deposited on the principal surface of the SOI substrate 1S substrate 1S by a CVD (Chemical Vapor Deposition) method and so forth and gate electrodes G1 and G2 are formed by patterning the polysilicon film by a lithographic technology and an etching technology (S103 in FIG. 17).

Then, offset spacers GOS and sidewall spacers SW are formed on side faces of the gate electrodes G1 and G2 (S104 and S105 in FIG. 17). The offset spacers GOS are each configured by, for example, a silicon oxide film. The sidewall spacers SW are each configured by, for example, a silicon nitride film.

Incidentally, the depression DB is formed in the end of the element isolation portion STI which is adjacent to the outer circumference of the active region ACT by performing the above-described processes. A part of a side surface at the vicinity of an upper corner of the semiconductor layer SL in the active region ACT is exposed from the depression DB. Thus, it becomes easy to form the outer circumference end of the semiconductor layer SL into a rounded shape and an inclined shape in comparison with formation of the central part thereof.

Figure 21:
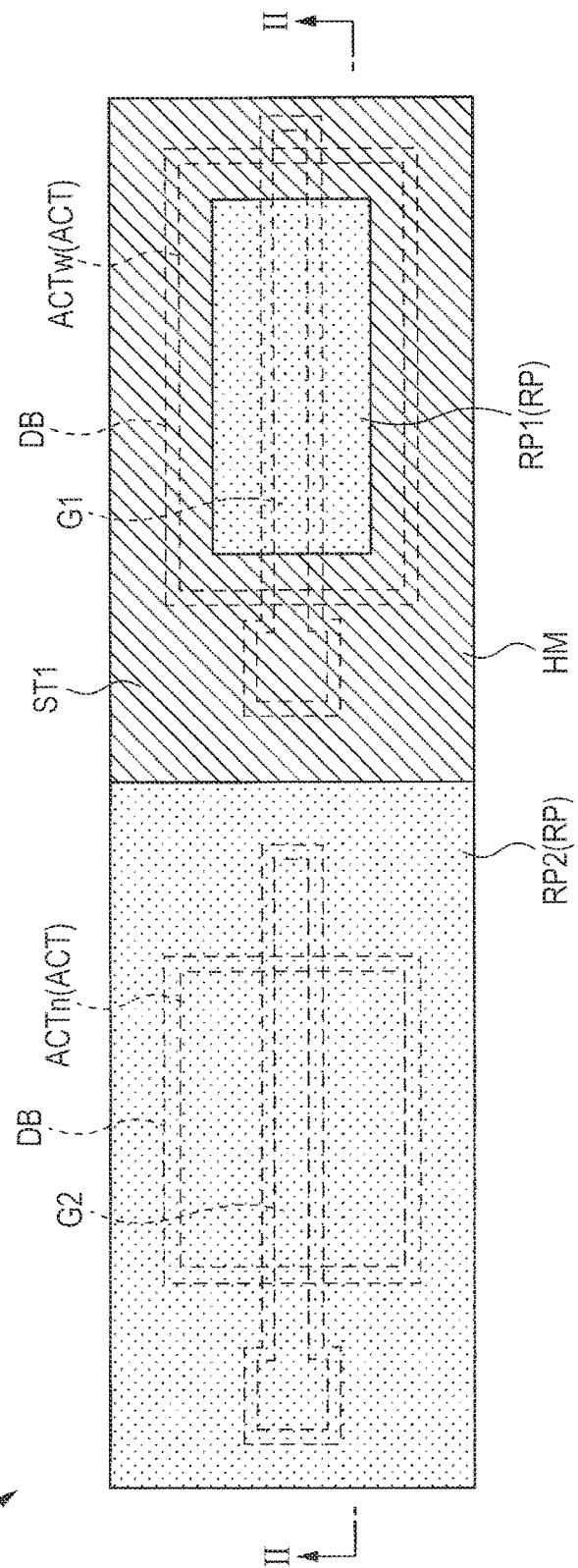
FIG. 21 is a plan view illustrating one example of the main parts on the principal plane of the SOI substrate in one process of the manufacturing method of the semiconductor device, following the process in FIG. 18.
Figure 22:
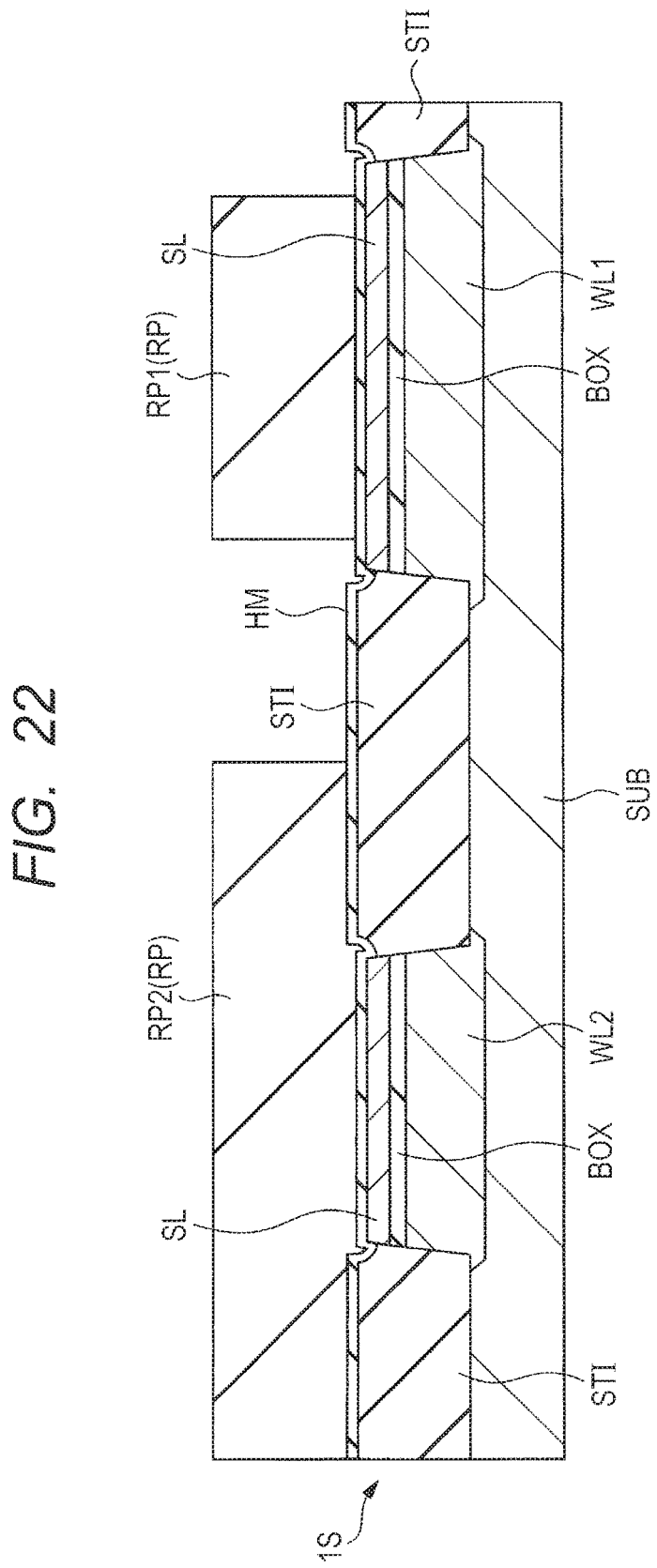
FIG. 22 is a sectional diagram along the II-II line in FIG. 21.

Then, FIG. 21 is a plan view illustrating one example of the main parts on the principal surface of the SOI substrate in one process of the method of manufacturing the semiconductor device, following the process in FIG. 18 and FIG. 22 is a sectional diagram along the II-II line in FIG. 21.

Here, a hard mask film (a masking layer) HM is deposited onto the principal surface of the SOI substrate 1S by the CVD method and so forth (S106 in FIG. 17). The hard mask film HM is made by a material different from that of the sidewall spacer SW in order to have selectivity (as to, for example, selective etching of the hard mask film HM) relative to the underlying sidewall spacer SW when etching the hard mask film HM. That is, in a case where the sidewall spacer SW is configured by the silicon nitride film (a nitride film), the hard mask film HM is configured by the silicon oxide film (an oxide film). On the other hand, in a case where the sidewall spacer SW is configured by the silicon oxide film, the hard mask film HM is configured by the silicon nitride film. Although the thickness of the hard mask HM which is, for example, about 2 nm to about 5 nm is sufficient, the thickness may be set to about 2 nm to about 10 nm.

Then, resist patterns RP (RP1 and RP2) are formed on/over the hard mask film HM by the lithographic technology. Thereby, the whole area of the active region ACTn and its surroundings is covered with the resist pattern RP2 on the narrow active region ACTn side. On the other hand, only a central part in the active region ACTw is covered with the resist pattern RP1 on the wide active region ACTw side. That is, the outer circumference end of the semiconductor layer SL in the wide active region ACTw is not covered with the resist pattern RP1. A length of a section of the semiconductor layer SL which is not covered with the resist pattern RP1 in the wide active region ACTw (that is, the length from an outer circumference of the resist pattern to the element isolation portion STI) is the length of the section where the above-described "trailing structure" is formed and is, for example, about 90 nm or about 60 nm.

Incidentally, in the above-described example, the semiconductor device is configured that the whole area of the outer circumference end of the semiconductor layer SL is not covered with the resist pattern RP1 on the wide active region ACTw side. However, in a case where the "trailing structure" is not formed on the both ends in the channel length direction of the semiconductor layer SL in the wide active region ACTw, the semiconductor device may be configured that only the both ends in the gate width direction of the outer circumference end of the semiconductor layer SL in the wide active region ACTw are not covered with the resist pattern RP1. Also in this case, the length from the outer circumference of the resist pattern RP1 to the element isolation portion STI is, for example, about 90 nm or about 60 nm.

Figure 23:
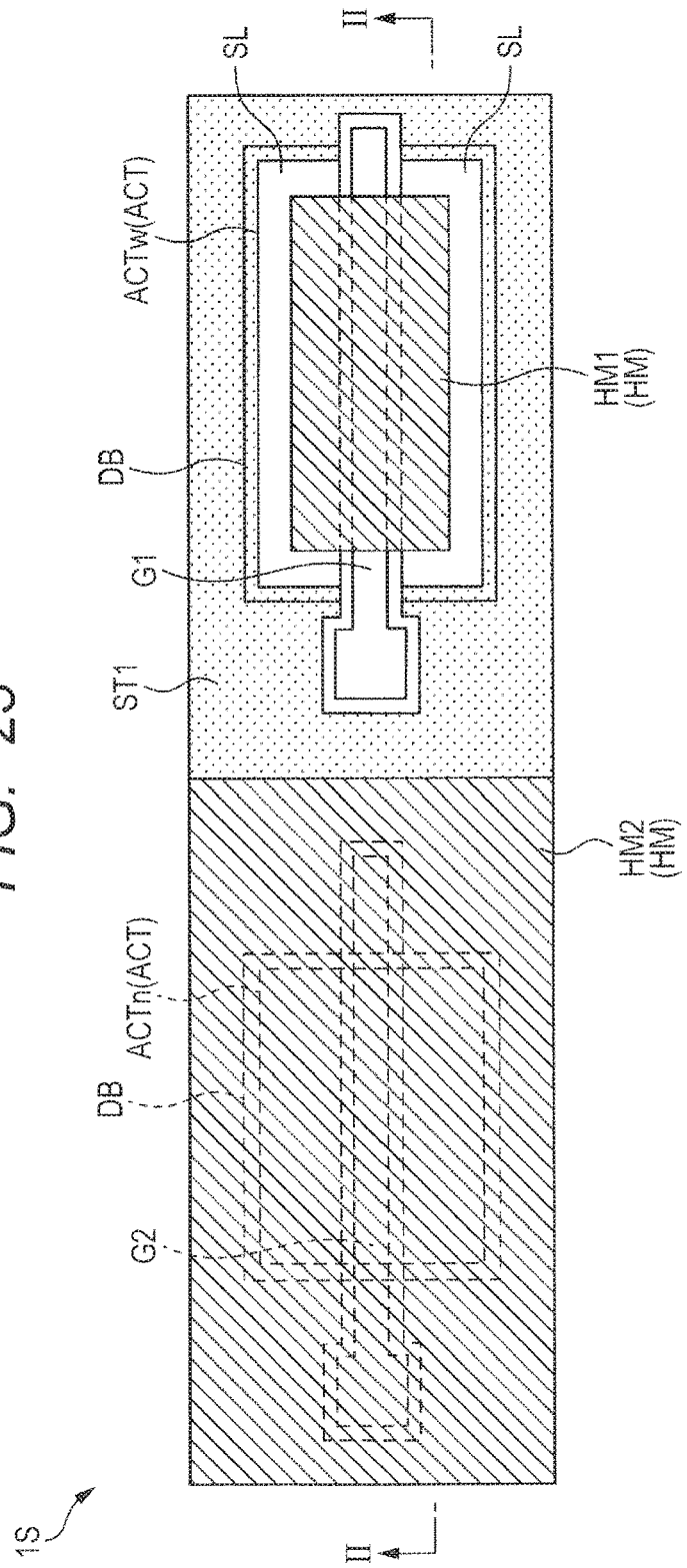
FIG. 23 is a plan view illustrating one example of the main parts on the principal plane of the SOI substrate in one process of the manufacturing method of the semiconductor device, following the process in FIG. 21.
Figure 24:
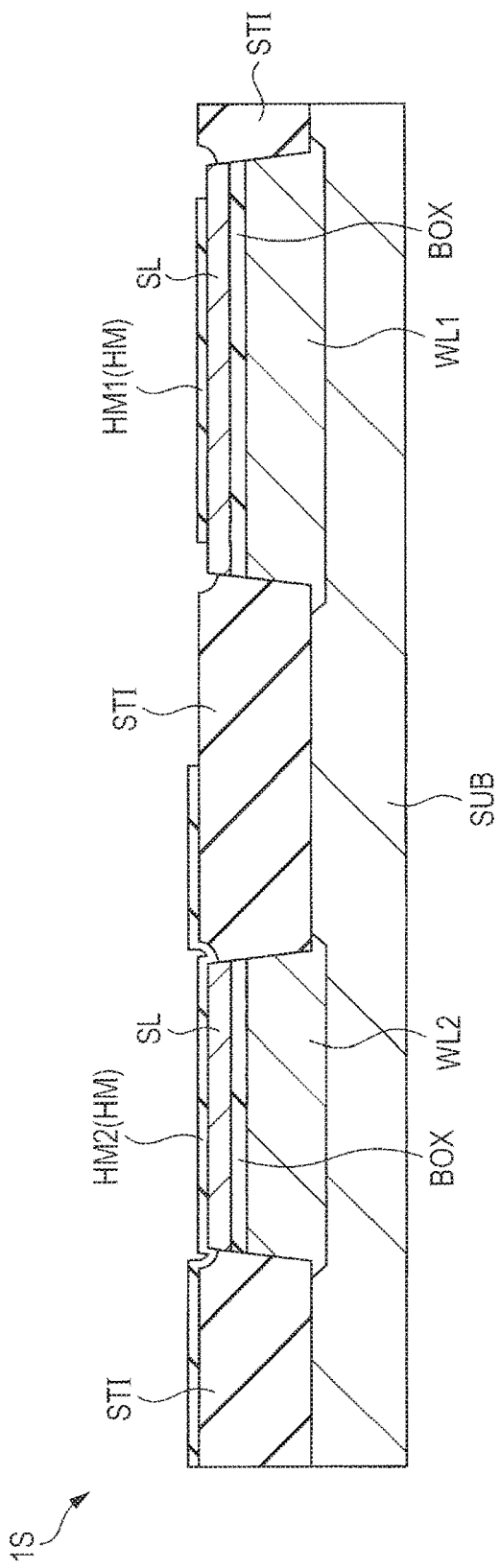
FIG. 24 is a sectional diagram along the II-II line in FIG. 23.

Then, FIG. 23 is a plan view illustrating one example of the main parts on the principal surface of the SOI substrate in one process of the method of manufacturing the semiconductor device, following the process in FIG. 21 and FIG. 24 is a sectional diagram along the II-II line in FIG. 23.

Here, hard mask patterns HM1 and HM2 are formed by etching the underlying hard mask film HM by using the above-described resist patterns RP (see FIG. 21 and FIG. 22) as etching masks. At this time, in a case where the hard mask film HM is configured by the silicon oxide film and then in a case where wet etching is used, hydrofluoric acid (HF), buffered hydrofluoric acid (BHF) and so forth are used, and then in a case where dry etching is used, fluorocarbon ($CF_4$) gas, trifluoromethane ($CHF_3$) gas, difluoromethane ($CH_2F_2$) gas and so forth are used. On the other hand, in a case where the hard mask film HM is configured by the silicon nitride film (the nitride film), the resist film is sensitive to heat and therefore it is not possible to use hot phosphoric acid ($H_3PO_4$) which is heated to about 150° C. Therefore, in a case where the hard mask film HM is configured by the silicon nitride film, it is preferable to use dry etching and in this case, the fluorocarbon ($CF_4$) gas, the trifluoromethane ($CHF_3$) gas, the difluoromethane ($CH_2F_2$) gas and so forth are used similarly to the above-described case. The hard mask film HM so formed is patterned and thereafter the resist patterns RP (RP1 and RP2) are removed by, for example, ashing and SPM (sulfuric acid/hydrogen peroxide mixture: an $H_2O/H_2SO_4$ mixed solution) washing (S107 in FIG. 17).

Thereby, the whole area of the active region ACTn and its surroundings is covered with the hard mask pattern HM2 in the narrow active region ACTn. On the other hand, only the central part of the semiconductor layer SL in the wide active region ACTw is covered with the hard mask pattern HM1 in the wide active region ACTw. That is, the outer circumference end (the whole circumference excluding sections where the gate electrodes G1 and G2 are arranged) of the semiconductor layer SL in the wide active region ACTw is not covered with the hard mask pattern HM1 and is partially exposed. A length of a section of the semiconductor layer SL which is not covered with the hard mask pattern HM1 in the wide active region ACTw (that is, the length from the outer circumference of the hard mask pattern HM1 to the element isolation portion STI) is the length of the section where the above-described "trailing structure" is formed and is, for example, about 90 nm or about 60 nm.

Incidentally, as described above, in a case where the semiconductor device is configured that only the both ends in the gate width direction of the outer circumference end of the semiconductor layer SL in the wide active region ACTw are not covered with the resist pattern RPI, only the both ends in the gate width direction of the outer circumference end of the semiconductor layer SL in the wide active region ACTw are not covered with the hard mask pattern HM1 and are partially exposed. Also in this case, the length from the outer circumference of the hard mask pattern HM1 to the element isolation portion STI is, for example, about 90 nm or about 60 nm.

Figure 25:
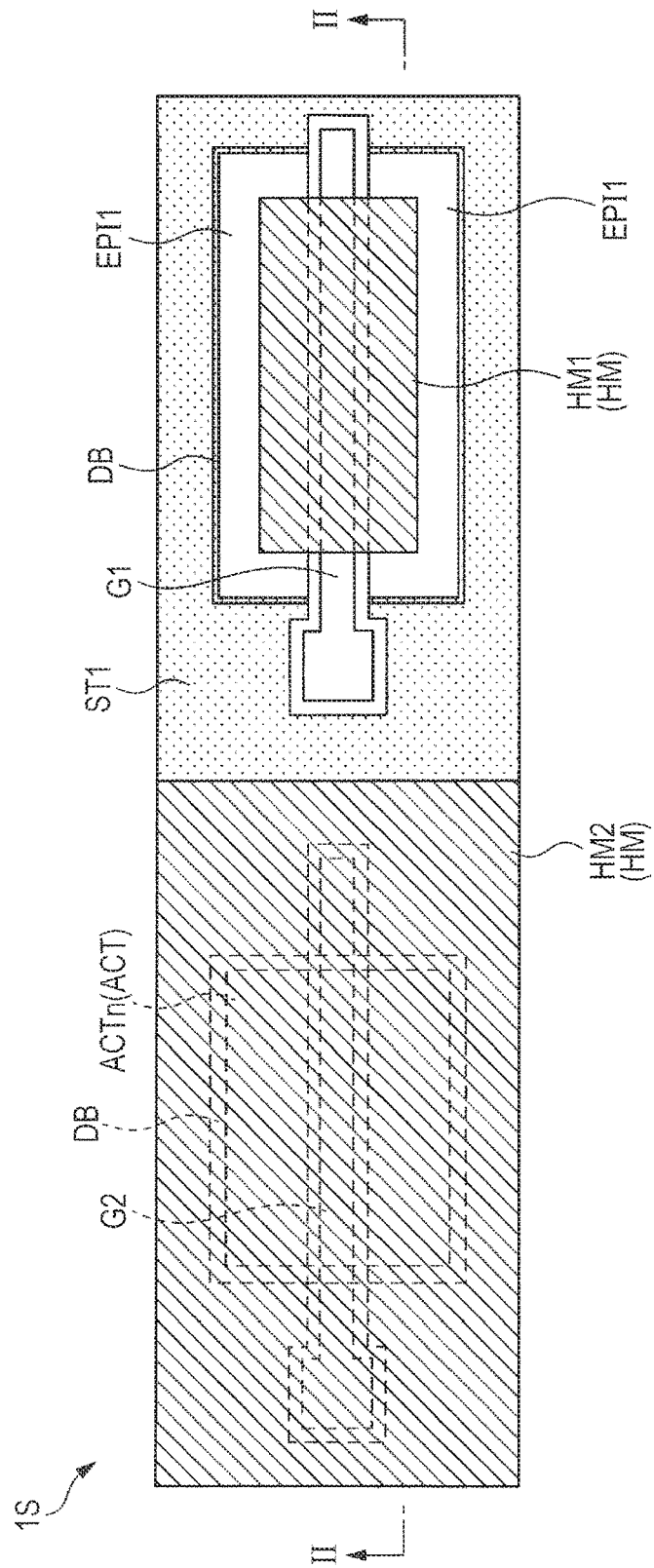
FIG. 25 is a plan view illustrating one example of the main parts on the principal plane of the SOI substrate in one process of the manufacturing method of the semiconductor device, following the process in FIG. 23.
Figure 26:
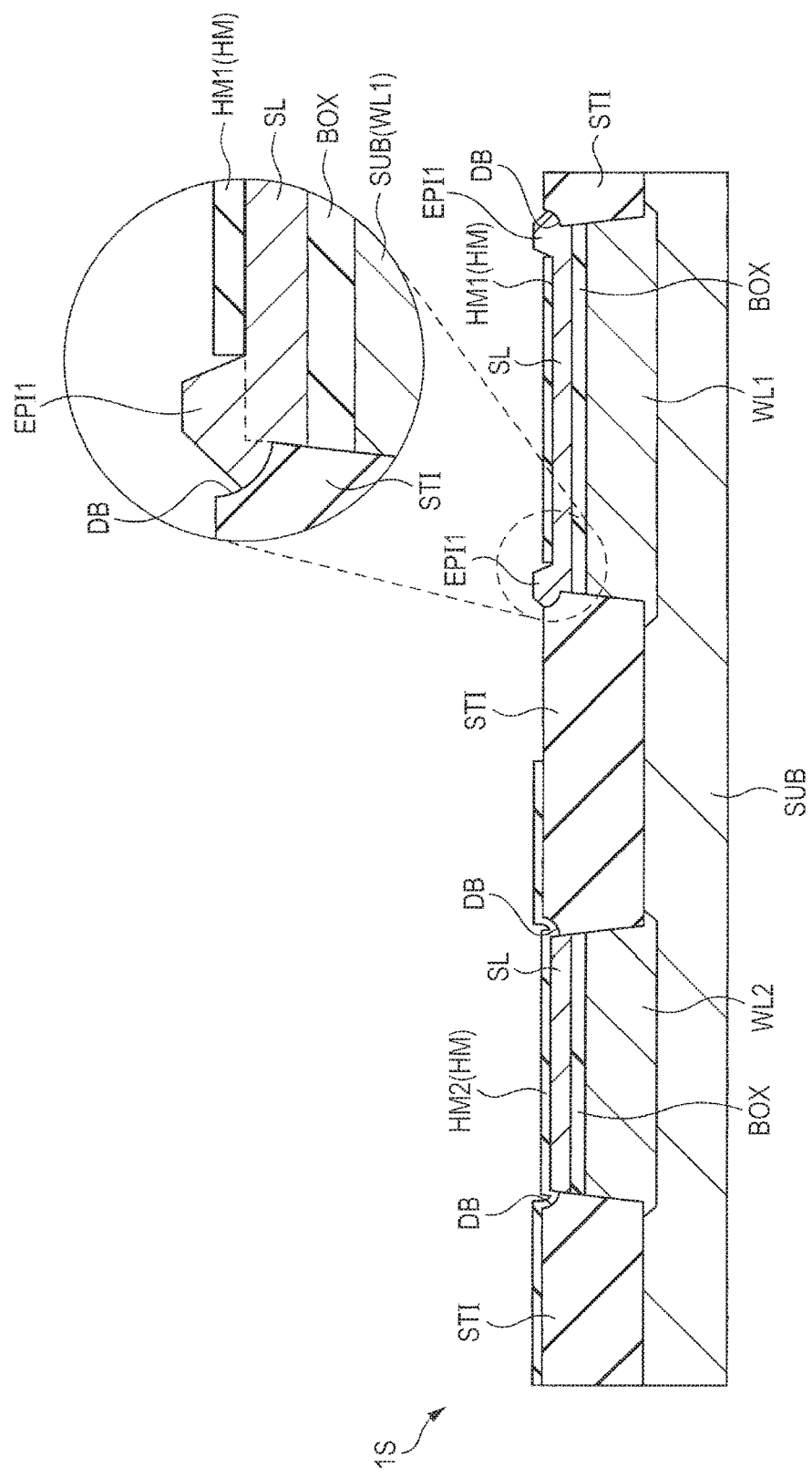
FIG. 26 is a sectional diagram along the II-II line in FIG. 25.

Then, FIG. 25 is a plan view illustrating one example of the main parts on the principal surface of the SOI substrate in one process of the method of manufacturing the semiconductor device, following the process in FIG. 23 and FIG. 26 is a sectional diagram along the II-II line in FIG. 25. Incidentally, in FIG. 26, a circled region illustrates an enlarged sectional diagram of a region surrounded by a broken line (the same is true of the following other drawings).

Here, a first selective epitaxial growth process is performed on the SOI substrate 1S substrate 1S in a state of leaving the hard mask patterns HM1 and HM2 as they are. Thereby, an epitaxial layer (a first epitaxial layer) EPI1 which is made of silicon (Si) and so forth is selectively formed on the outer circumference end (the whole circumference excluding the sections where the gate electrodes G1 and G2 are arranged) of the semiconductor layer SL in the wide active region ACTw (S108 in FIG. 17). Incidentally, the central part of the wide active region ACTw is covered with the hard mask pattern HM1 and the narrow active region ACTn is covered with the hard mask pattern HM2. Therefore, the epitaxial layer EPI is not formed on/over the central part of the semiconductor layer SL in the wide active region ACTw and on/over the semiconductor layer SL in the narrow active region ACTn.

In the first selective epitaxial growth process, for example, a gas which contains dichlorosilane ($SiH_2Cl_2$), hydrogen chloride (HCl) and hydrogen ($H_2$) is used and a film deposition condition that a pressure is not less than 10 Pa and not more than 1000 Pa and a temperature is not less than 700° C. and not more than 800° C. is used. However, the gas and the film formation condition are not limited to the above and, for example, a gas which contains silane ($SiH_4$), chlorine (Cl) and hydrogen ($H_2$) may be use and a film deposition condition that the pressure is not less than 10 Pa and not more than 1000 Pa and the temperature is not less than 500° C. and not more than 700° C. may be used.

At this time, dichlorosilane and silane are used as source gases of silicon. On the other hand, hydrogen chloride and chlorine are used for ensuring the selectivity in the first selective epitaxial growth process and hydrogen is used so as not to contain moisture and oxygen in a gaseous atmosphere as much as possible. It is also possible to perform hydrogen annealing, for example, at a temperature of about 700° C. to about 900° C. in a state of maintaining a vacuum state directly before performance of the epitaxial growth for forming an epitaxial layer EPI1 for stabilization of the epitaxial growth. Further, in the first selective epitaxial growth process, for example, a film deposition device (a vertical furnace) which is able to process the plurality of SOI substrates IS simultaneously and the inner wall of which is coated with silicon is used.

As described above, in the present embodiment, the epitaxial layer EPI1 is partially formed in advance on the outer circumference end (that is, the section which is formed into the "trailing structure") of the semiconductor layer SL on which the epitaxial layer is grown thin in the wide active region ACTw. Thereby, it is possible to compensate for a shortage of the thickness of the epitaxial layer which would occur on the outer circumference end of the semiconductor layer SL in the wide active region ACTw.

In addition, the epitaxial layer EPI1 is formed in a state of projecting upward on the outer circumference of the upper face of the semiconductor layer SL in the wide active region ACTw. In addition, the outer circumference end of the epitaxial layer EPI1 extends into the depression DB in the element isolation portion STI and overhangs the element isolation portion EPI. Further, the outer circumference end of the epitaxial layer EPI1 is formed in a state of covering also the part of a side surface at the vicinity of the upper corner of the semiconductor layer SL.

Figure 27:
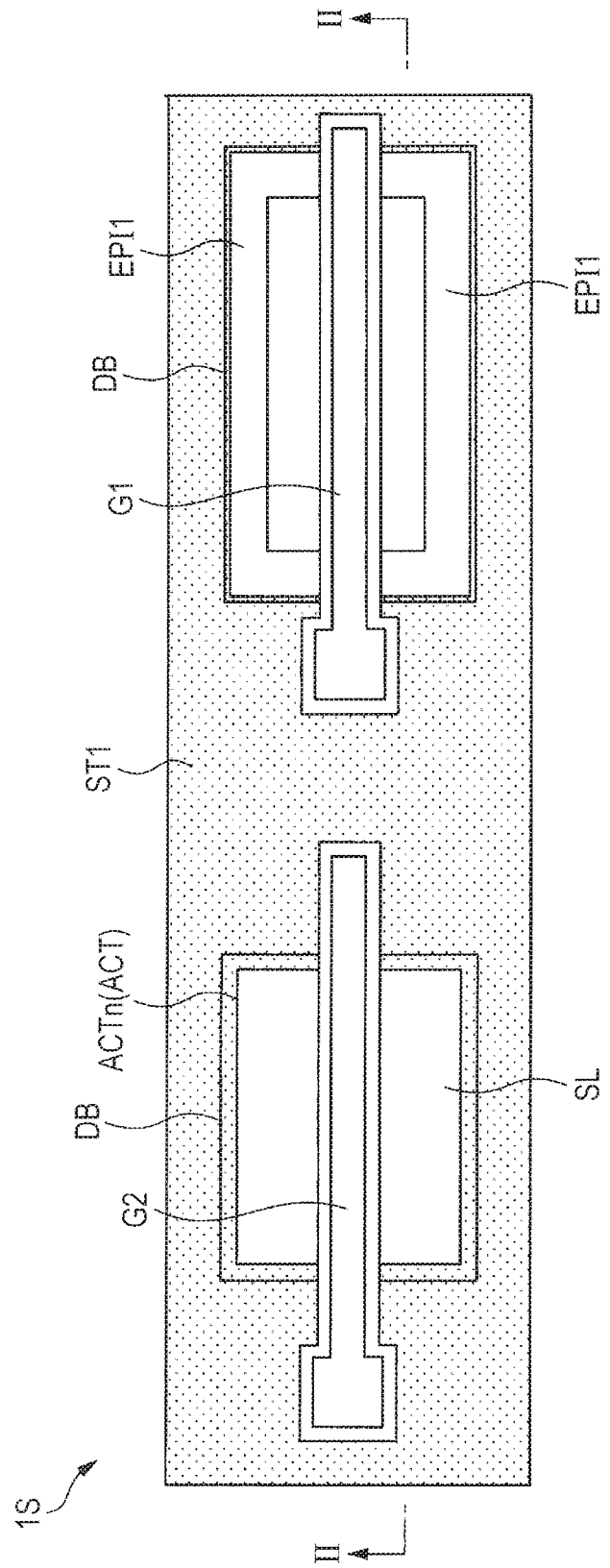
FIG. 27 is a plan view illustrating one example of the main parts on the principal plane of the SOI substrate in one process of the manufacturing method of the semiconductor device, following the process in FIG. 25.
Figure 28:
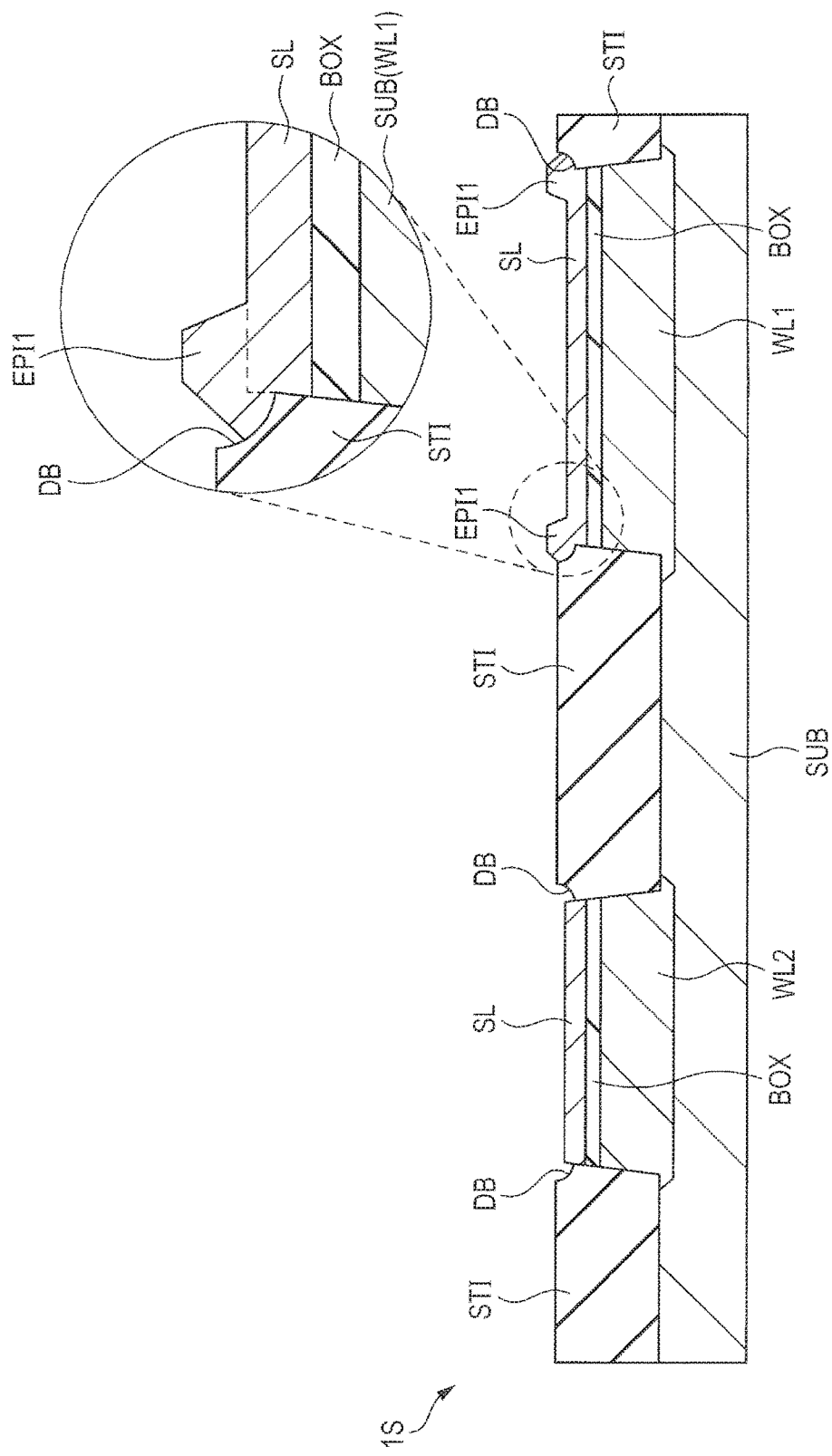
FIG. 28 is a sectional diagram along the II-II line in FIG. 27.

Then, FIG. 27 is a plan view illustrating one example of the main parts on the principal surface of the SOI substrate 1S substrate 1S in one process of the method of manufacturing the semiconductor device, following the process in FIG. 25 and FIG. 28 is a sectional diagram along the II-II line in FIG. 27.

Here, the hard mask patterns HM1 and HM2 (see FIG. 25 and FIG. 26) are removed to expose the semiconductor layers SL formed in the whole areas of the narrow active region ACTn and the wide active region ACTw of the SOI substrate 1S substrate 1S (S109 in FIG. 17). At this time, a step is formed on the upper face of the semiconductor layer SL in the wide active region ACTw by the epitaxial layer EPI1 which is formed on the outer circumference end of the semiconductor layer SL. In addition, the exposed area of the semiconductor layer SL itself is reduced by the amount corresponding to the area of the epitaxial layer EPI1 on the upper face of the semiconductor layer SL in the wide active region ACTw.

Figure 29:
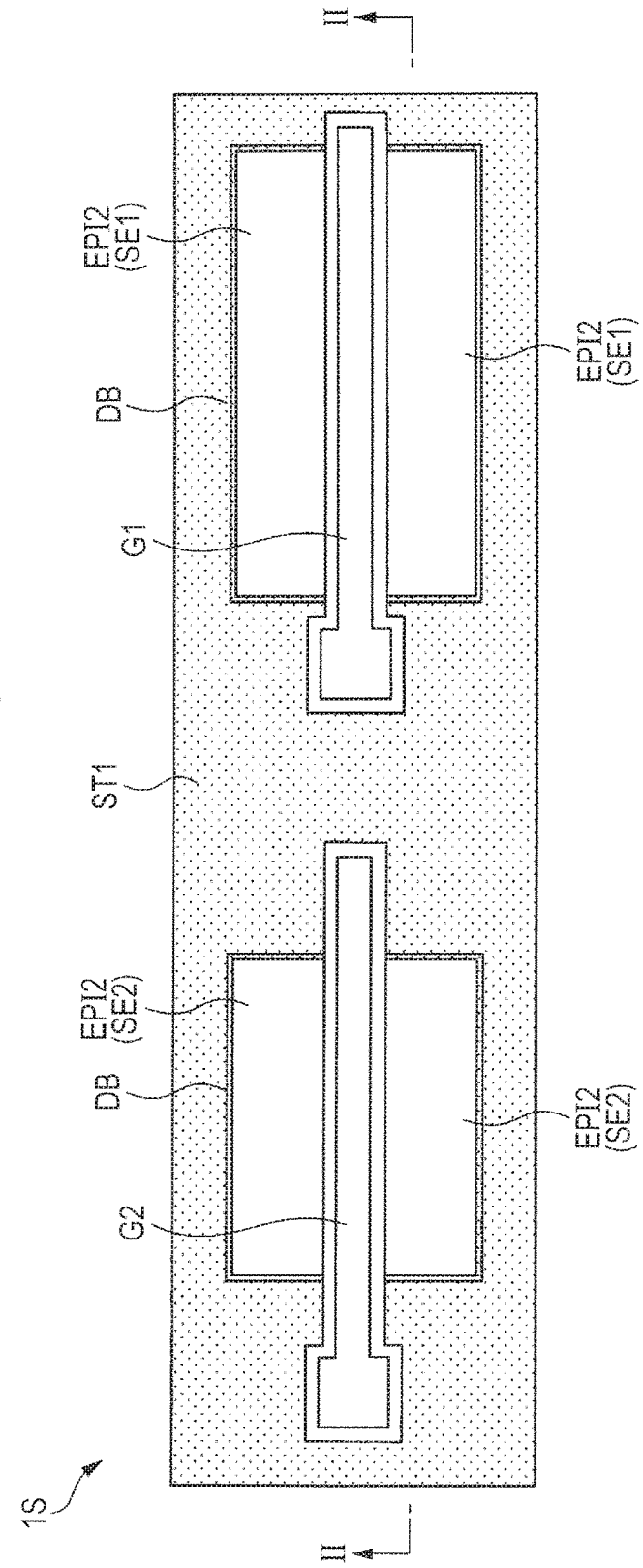
FIG. 29 is a plan view illustrating one example of the main parts on the principal plane of the SOI substrate in one process of the manufacturing method of the semiconductor device, following the process in FIG. 27.
Figure 30:
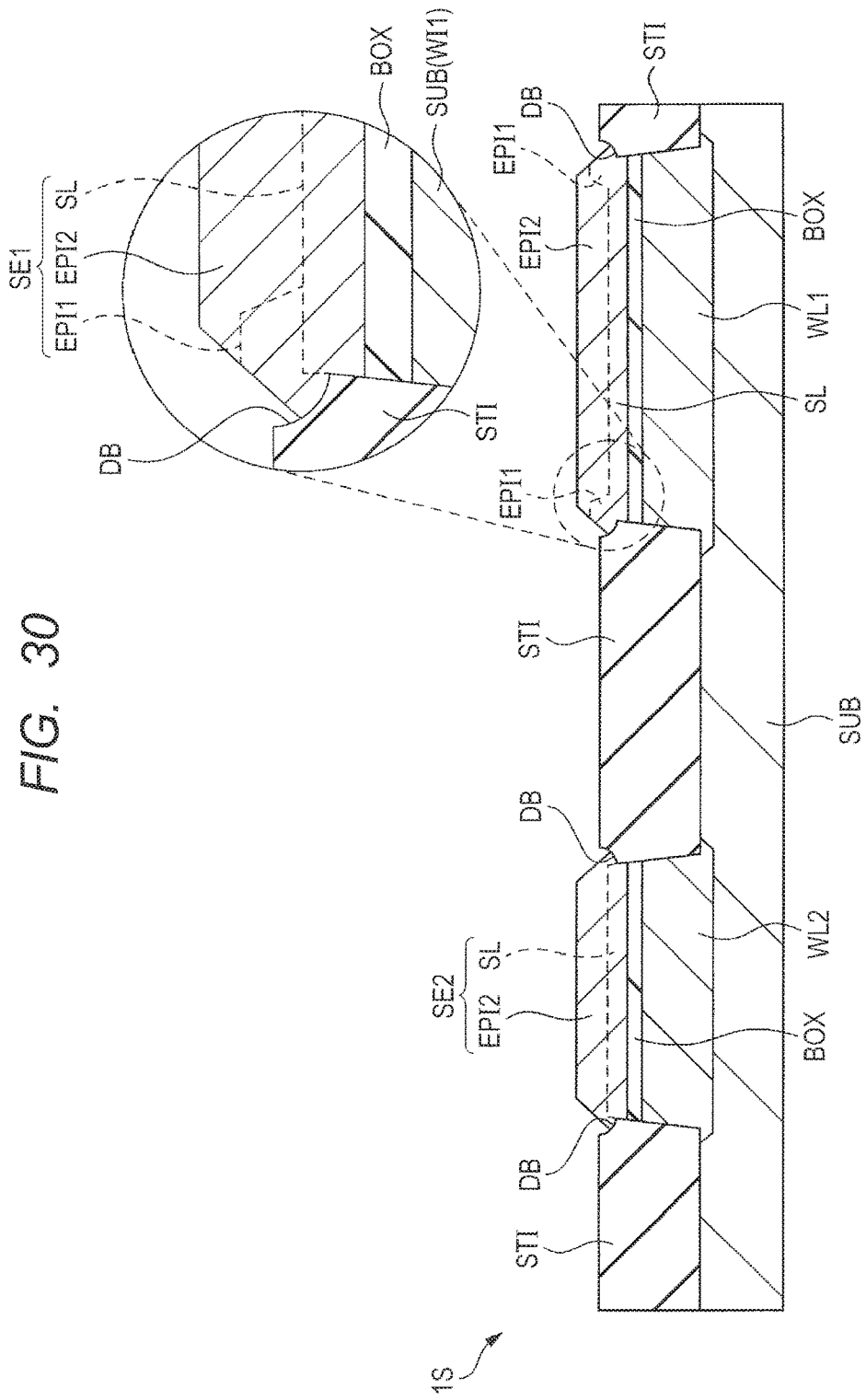
FIG. 30 is a sectional diagram along the II-II line in FIG. 29.

Then, FIG. 29 is a plan view illustrating one example of the main parts on the principal surface of the SOI substrate 1S substrate 1S in one process of the method of manufacturing the semiconductor device, following the process in FIG. 27 and FIG. 30 is a sectional diagram along the II-II line in FIG. 29.

Here, a second selective epitaxial growth process is performed on the SOI substrate 1S substrate 1S. Thereby, an epitaxial layer (a second epitaxial layer) EPI2 which is made of silicon (Si) and so forth is selectively formed on/over the semiconductor layer SL in the narrow active region ACTn, the semiconductor layer SL in the wide active region ACTw and the epitaxial layer EPI1 (S110 in FIG. 17). A way, a condition and so forth used for performing the second selective epitaxial growth process are the same as those described in the column of the first selective epitaxial growth process.

A semiconductor layer SE2 having the semiconductor layer SL and the epitaxial layer EPI2 is formed in the narrow active region ACTn by performing the second selective epitaxial growth process. An outer circumference end of the epitaxial layer EPI2 of the semiconductor layer SE2 in the narrow active region ACTn extends into the depression DB in the element isolation portion STI and overhangs the element isolation portion STI. In addition, the outer circumference end of the epitaxial layer EPI2 of the semiconductor layer SE2 is formed in a state of covering the part of a side surface at the vicinity of the upper corner of the semiconductor layer SL. Then, the shape of the outer circumference end of the semiconductor layer SE2 exhibits the "facet structure".

On the other hand, a semiconductor layer SE1 having the semiconductor layer SL and the epitaxial layers EPI1 and EPI2 is formed in the wide active region ACTw by performing the second selective epitaxial growth process. In the present embodiment, since the epitaxial layer EPI1 is formed on the outer circumference end of the semiconductor layer SL in the wide active region ACTw at the preliminary stage, it is possible to form the shape of an outer circumference end of the semiconductor layer SE1 in the wide active region ACTw into the "facet structure" which is the same as that of the outer circumference end of the semiconductor layer SE2 in the narrow active region ACTn. That is, it is possible to eliminate a difference in shape of the outer circumference end between the semiconductor layer SE1 in the wide active region ACTw and the semiconductor layer SE2 in the narrow active region ACTn. Therefore, it is possible to sufficiently secure the thickness of the outer circumference end of the semiconductor layer SE1 in the wide active region ACTw.

Incidentally, the condition and so forth may be set in such a manner that the height of the semiconductor layer SE1 in the wide active region ACTw becomes equal to the height of the semiconductor layer SE2 in the narrow active region ACTn when performing the second selective epitaxial growth process. Thereby, since it is possible to make profiles of the impurities for formation of a source region and a drain region which will be described later uniform, it is possible to improve performance and reliability of the semiconductor device.

Then, the sidewall spacers SW (see FIG. 20) are removed (S111 in FIG. 17) and thereafter an extension region is formed by the lithographic technology, the ion implantation method and so forth (S112 in FIG. 17). Then, the sidewall spacers SW are again formed on the both sidewalls of the gate electrode G (S113 in FIG. 17). Then, the conductivity type impurities are introduced into the semiconductor layer SE1 (the semiconductor layer SL and the epitaxial layers EPI1 and EPI2) in the wide active region ACTw and the conductivity type impurities are introduced also into the semiconductor layer SE2 (the semiconductor layer SL and the epitaxial layer EPI2) in the narrow active region ACTn by the lithographic technology, the ion implantation method and so forth. Thereby, the source region and the drain region are formed (S114 in FIG. 17).

Figure 31:
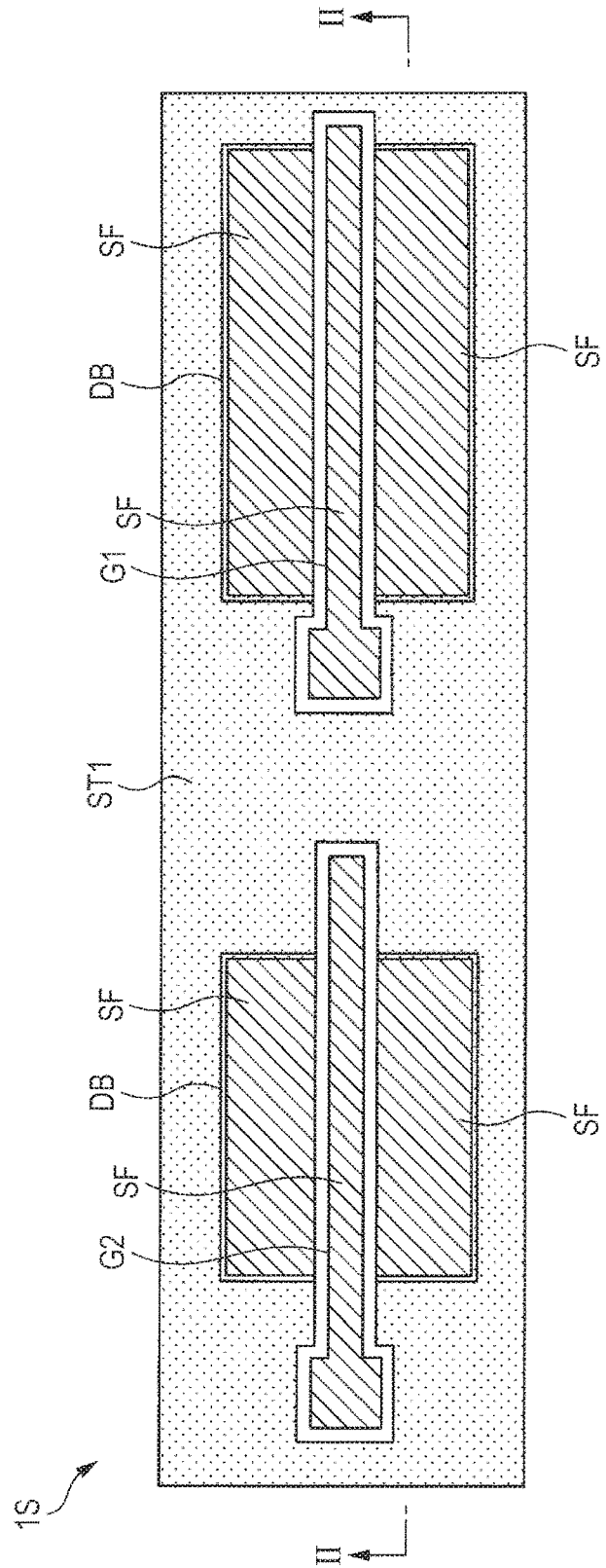
FIG. 31 is a plan view illustrating one example of the main parts on the principal plane of the SOI substrate after performance of a silicide formation process in the manufacturing method of the semiconductor device.
Figure 32:
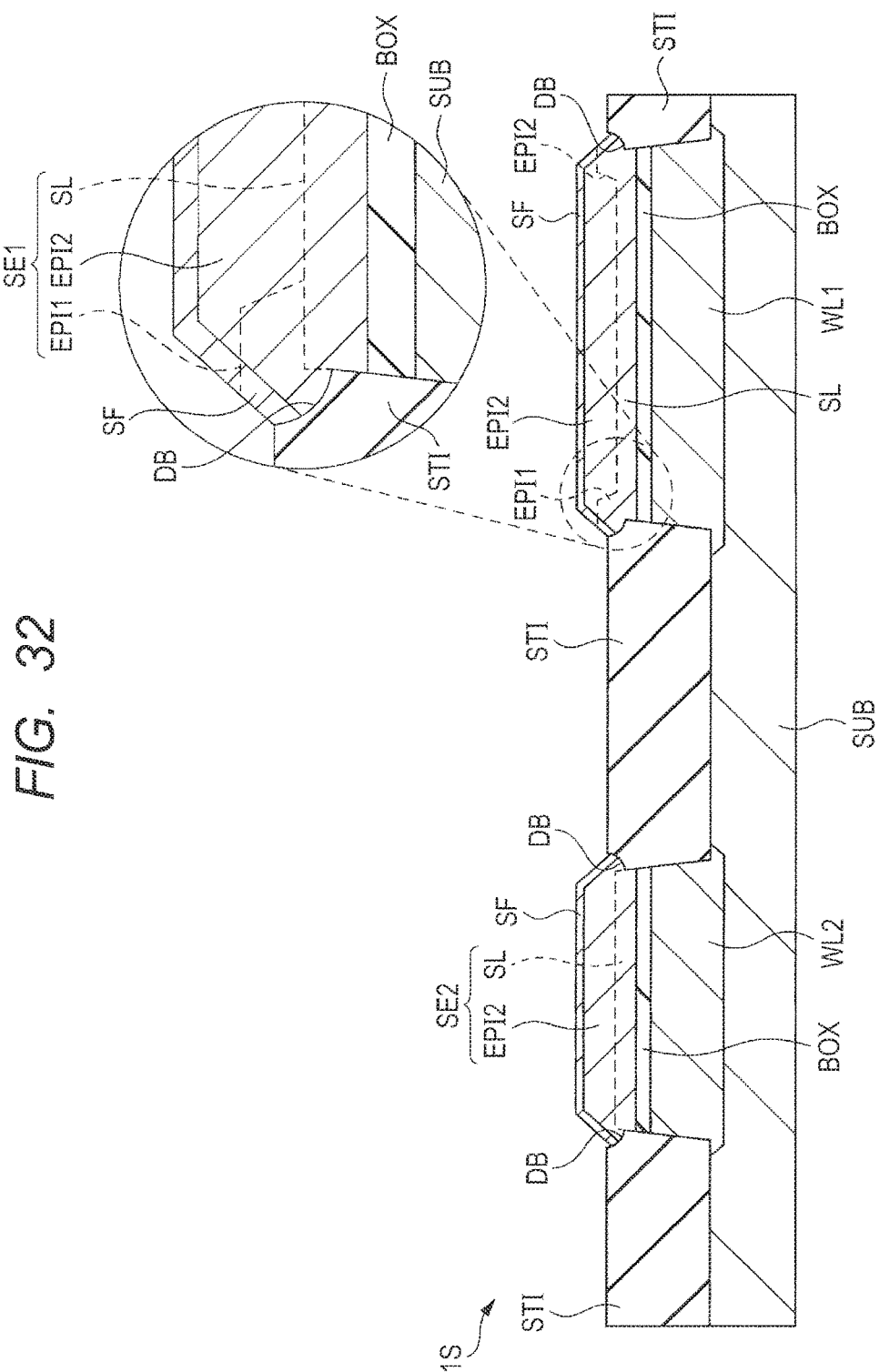
FIG. 32 is a sectional diagram along the II-II line in FIG. 31.

Then, FIG. 31 is a plan view illustrating one example of the main parts on the principal surface of the SOI substrate 1S substrate 1S after performance of a silicide formation process in the method of manufacturing the semiconductor device and FIG. 32 is a sectional diagram along the II-II line in FIG. 31.

Here, the silicide films SF are formed on/over upper faces of the gate electrodes G1 and G2, surfaces of the semiconductor layers SE1 and SE2 and a surface of the active region ACTp for power supply (S115 in FIG. 17).

Figure 33:
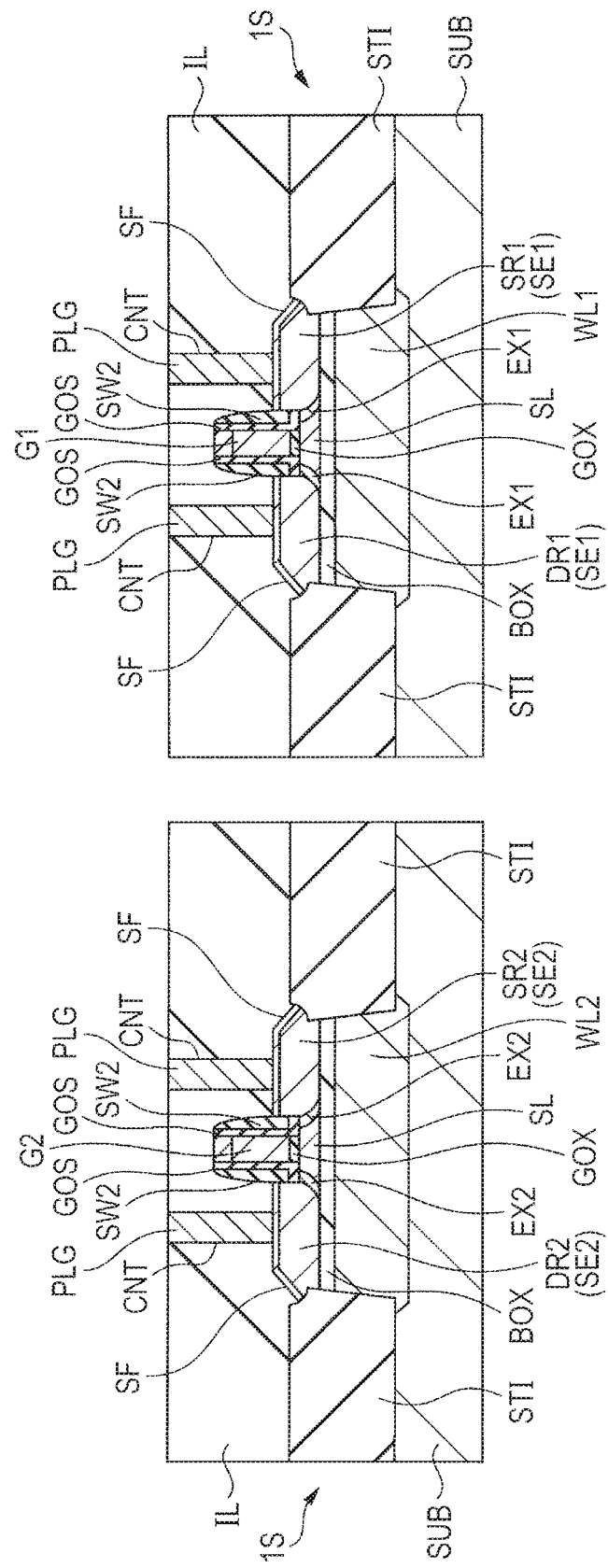
FIG. 33 is left-side and right-side sectional diagrams of parts along the line and the IV-IV line in FIG. 18 respectively in the SOI substrate in one process of the manufacturing method of the semiconductor device, following the process in FIG. 31.

Then, FIG. 33 is left-side and right-side sectional diagrams of parts corresponding to sections along the III-III line and the IV-IV line in FIG. 18 in one process of the method of manufacturing the semiconductor device, following the process in FIG. 31. Incidentally, EX1 and EX2 denote the extension regions formed in S112 in FIG. 17, SW2 denotes the sidewall spacers which are formed again in step S113 in FIG. 17, SR denotes the source region formed in S114 in FIG. 17 and DR denotes the drain region formed in S114 in FIG. 17.

Here, the interlayer insulating film IL which is configured by, for example, a silicon oxide film is deposited on the principal surface of the SOI substrate 1S substrate 1S by the CVD method and so forth (S116 in FIG. 17) and thereafter the plurality of contact holes CNT are formed in the interlayer insulating film IL by the lithographic technology and the etching technology (S117 in FIG. 17). Each of the contact holes CNT is formed in such a manner that the bottom face thereof reaches the silicide film SF. Then, the plug PLG is formed by burying a conductivity type material such as tungsten and so forth into each contact hole CNT (S118 in FIG. 17) and thereafter a wiring formation process is performed (S119 in FIG. 17). Thereby, the semiconductor device is manufactured.

Here, in the field effect transistor using the SOI substrate 1S substrate 1S, film-thinning of the semiconductor layer SL and the buried insulating film BOX is promoted. In particular, in a semiconductor device including the fully depleted transistor which adjusts the threshold voltage of the field effect transistor on the basis of the back-gate voltage, it is necessary to decrease the thicknesses of the semiconductor layer SL and the buried insulating film BOX as described above. For this reason, in a case where the outer circumference end of the semiconductor layer SE1 in the wide active region ACTw is formed into the "hemming structure" in formation of the contact holes CNT, the issue that the contact holes CNT penetrate through the semiconductor layer SL and reach the support substrate SUB is liable to occur ordinarily. In contrast, in the present embodiment, in formation of the contact holes CNT, the outer circumference end of the semiconductor layer SE1 in the wide active region ACTw is formed into the "facet structure" similarly to the outer circumference end of the semiconductor layer SE2 in the narrow active region ACTn. That is, the thickness of the outer circumference end of the semiconductor layer SE1 in the wide active region ACTw is sufficiently secured similarly to the outer circumference end of the semiconductor layer SE2 in the narrow active region ACTn. Therefore, since the semiconductor layer SE1 in the wide active region ACTw sufficiently functions as the etching stopper in formation of the contact holes CNT, the contact holes CNT do not penetrate through the semiconductor layer SE1. Accordingly, it is possible to prevent occurrence of the erroneous conduction between the semiconductor layer SE1 in the wide active region ACTw and the support substrate SUB.

Configuration Example of Semiconductor Device

Then, one example of the semiconductor device so manufactured as described above will be described with reference to FIG. 34 to FIG. 39.

Figure 34:
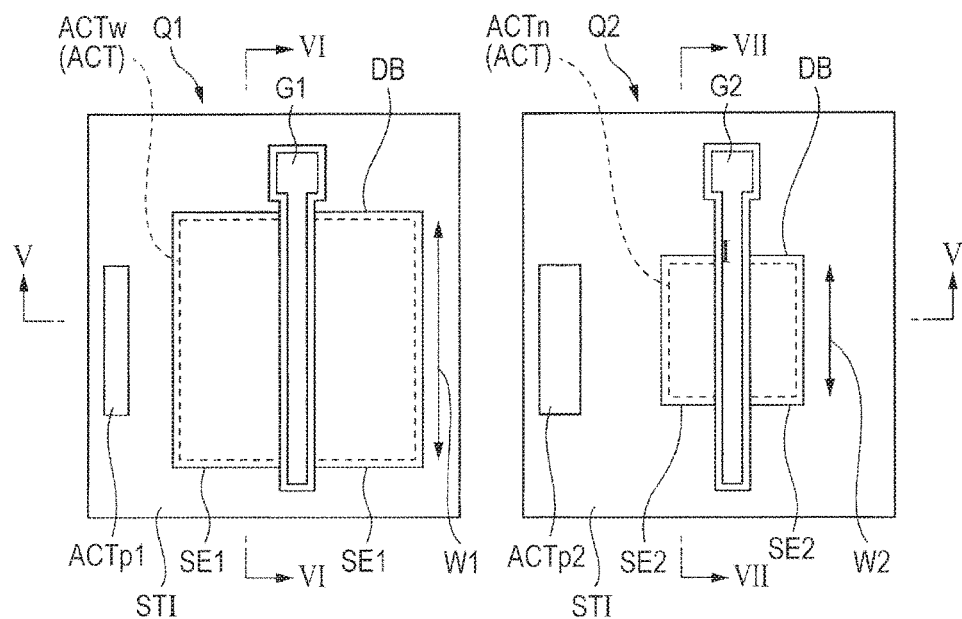
FIG. 34 is a plan view illustrating one example of the main parts on the principal plane of the SOI substrate which configures the semiconductor device according to the present embodiment.
Figure 35:
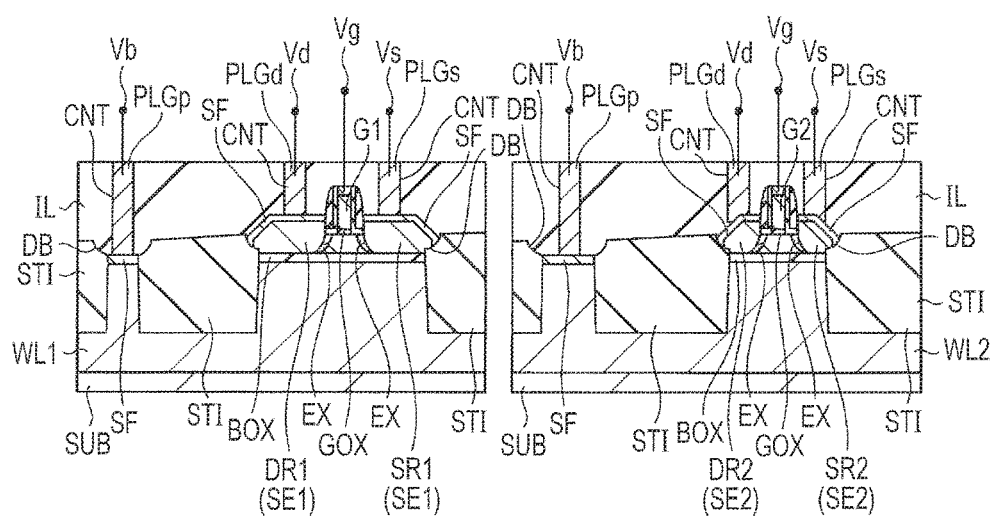
FIG. 35 is a sectional diagram along the V-V line in FIG. 34.
Figure 36:
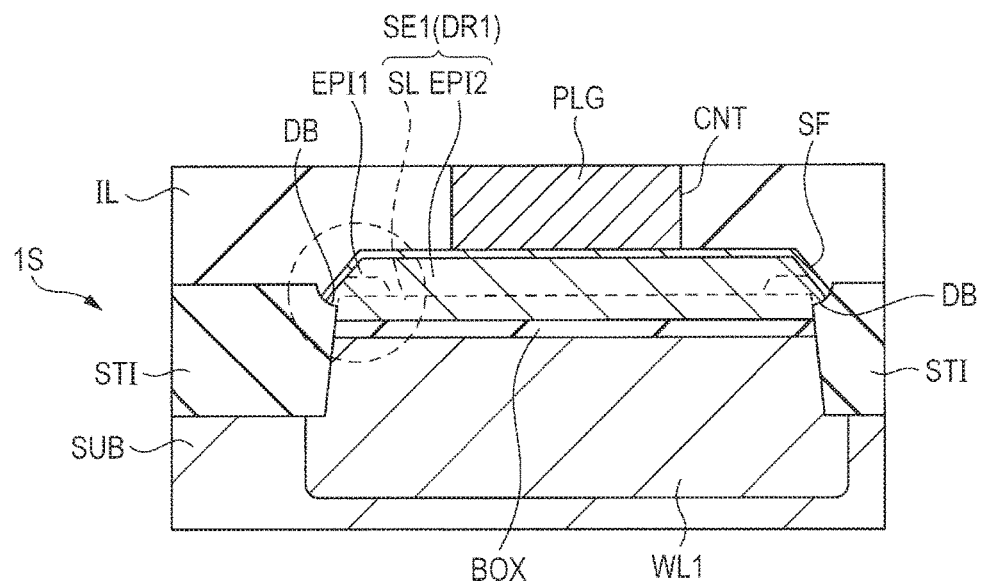
FIG. 36 is a sectional diagram along the VIU-VI line in FIG. 34.
Figure 37:
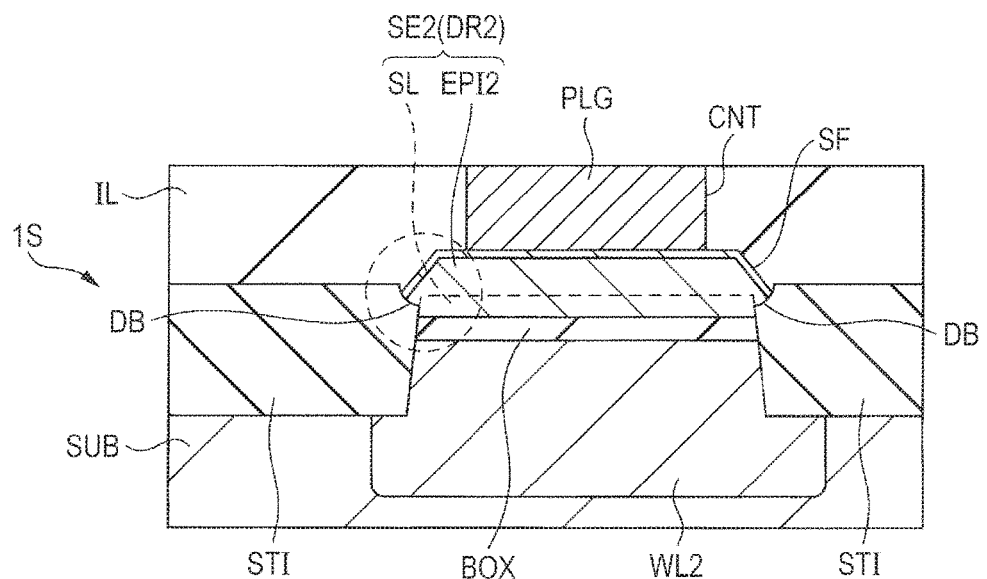
FIG. 37 is a sectional diagram along the VII-VII line in FIG. 34.
Figure 38:
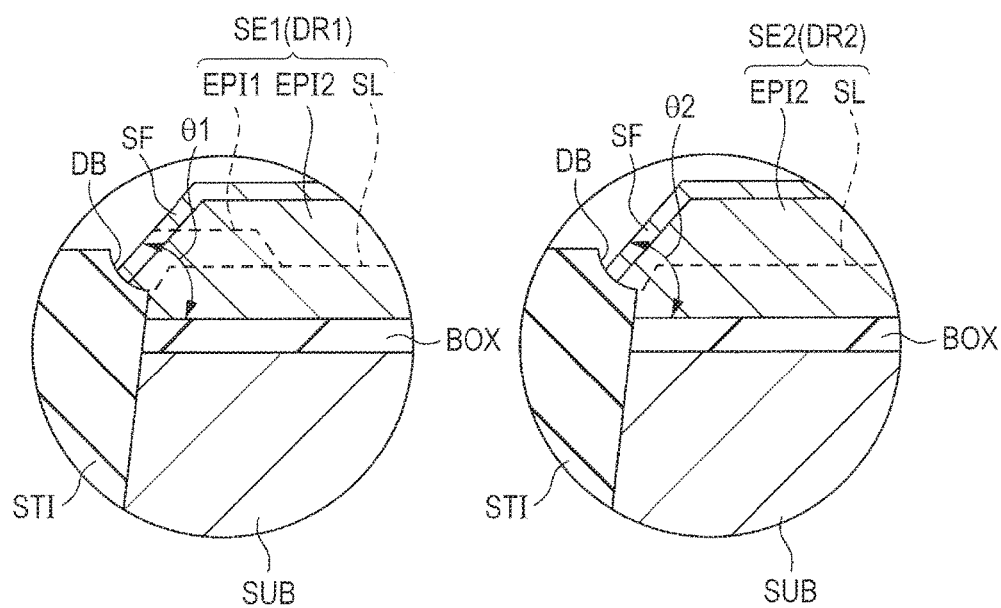
FIG. 38 is left-side and right-side enlarged sectional diagrams of regions surrounded by broken lines in FIG. 36 and FIG. 37 respectively.

FIG. 34 is a plan view illustrating one example of the main parts on the principal surface of the SOI substrate which configures the semiconductor device according to the present embodiment, FIG. 35 is a sectional diagram along the V-V line in FIG. 34, FIG. 36 is a sectional diagram along the VI-VI line in FIG. 34, FIG. 37 is a sectional diagram along the VII-VII line in FIG. 34 and FIG. 38 is left-side and right-side enlarged sectional diagrams illustrating regions surrounded by broken lines respectively in FIG. 36 and FIG. 37.

Field effect transistors Q1 and Q2 are formed on the SOI substrate 1S substrate 1S which configures the semiconductor device according to the present embodiment. The field effect transistors Q1 and Q2 are each configured by, for example, the fully depleted transistor. The fully depleted transistor is highly excellent in suppression of the short-channel effect and is also excellent in that since the impurities are not introduced into channel regions (the semiconductor layers SL formed directly under the gate electrodes G1 and G2), the variation in threshold voltage caused by the variation in impurities is small. Therefore, it is possible to provide the semiconductor device which is excellent in performance by adopting the fully depleted transistor. As described above, in the fully depleted transistor, it is necessary to form the semiconductor layer SL and the buried insulating film BOX thin. Accordingly, in the present embodiment, the thickness of the semiconductor layer SL is set to not less than 5 nm and not more than 20 nm and the thickness of the buried insulating film BOX is also set to not less than 5 nm and not more than 20 nm. Thereby, it is possible to achieve the field effect transistors Q1 and Q2 which are each configured by the fully depleted transistor and it becomes easy to adjust the threshold voltages of the field effect transistors Q1 and Q2 also on the basis of the back-gate potentials applied to the wells WL1 and WL2.

As illustrated in FIG. 34, the field effect transistor Q1 is arranged in the wide active region ACTw that the width W1 in the gate width direction is greater than or equal to 0.25 μm (250 nm: the first length).

The gate electrode G1 of the field effect transistor Q1 is arranged on a central part in the channel length direction which is orthogonal to the gate width direction in the wide active region ACTw in a state of striding over the wide active region ACTw. As illustrated in FIG. 35, the gate electrode G1 is formed over the semiconductor layer SL in the wide active region ACTw via the gate insulating film GOX. In addition, the sidewall spacers SW are formed on the side faces of the gate electrode G1 of the field effect transistor Q1 via the offset spacers GOS (see FIG. 33). In addition, the silicide layer SF is formed on/over the upper face of the gate electrode G1 (see FIG. 33).

In addition, as illustrated in FIG. 34, the semiconductor layers (the laminated bodies) SE1 are formed on the both sides of the gate electrode G1 with the gate electrode G1 being interposed in the wide active region ACTw. As described above, the semiconductor layer SE1 includes the semiconductor layer SL and the epitaxial layers EP1 and EP2 as illustrated in FIG. 35, FIG. 36 and FIG. 38 (the left-side diagrams). As described with reference to FIG. 26, the outer circumference end of the epitaxial layer EPI1 of the semiconductor layer SE1 extends into the depression DB in the element isolation portion STI and overhangs the element isolation portion STI. Further, the outer circumference end of the epitaxial layer EPI1 of the semiconductor layer SE1 is formed in a state of covering also the part of a side surface at the vicinity of the upper corner of the semiconductor layer SL.

A source region SR1 and a drain region DR1 of the field effect transistor Q1 are formed in the semiconductor layers SE1. Here, although, in the fully depleted transistor, the semiconductor layer SL is thinned, when the semiconductor layer SL is thinned, respective resistance values of the source region SR1 and the drain region DR1 of the field effect transistor Q1 are increased. Thus, in the present embodiment, the source region SR1 and the drain region DR1 of the field effect transistor Q1 are each formed in the semiconductor layer SE1 (the laminated body of the semiconductor layer SL and the epitaxial layers EPI1 and EPI2). Thereby, it is possible to achieve the fully depleted transistor by leaving the semiconductor layer SL thin directly under the gate electrode G1 and it is also possible to decrease the respective resistance values of the source region SR1 and the drain region DR1 by thickening the semiconductor layers SL for the source region SR1 and the drain region DR1. Thereby, according to the present embodiment, it is possible to improve the performance of the field effect transistor Q1.

In addition, as illustrated in FIG. 35, the extension regions EX are formed at positions adjacent to the channel sides of the source region SR1 and the drain region DR1 in the semiconductor layer SL under the gate electrode G1 in alignment with the gate electrode G1. In addition, the silicide layers SF are formed on/over the surfaces of the semiconductor layers SE1 in which the source region SR1 and the drain region DR1 are formed respectively.

In addition, as illustrated in FIG. 34, an active region ACTp1 for power supply to the well WL1 of the field effect transistor Q1 is formed at a position separated from the wide active region ACTw. As illustrated in FIG. 35, the silicide layer SF is formed over the upper face of the support substrate SUB via the well WL1 in the active region ACTp1.

On the other hand, as illustrated in FIG. 34, the field effect transistor Q2 is arranged in the narrow active region ACTn that the width W2 in the gate width direction is less than 0.25 μm (250 nm).

The gate electrode G2 of the field effect transistor Q2 is arranged on a central part in the channel length direction which is orthogonal to the gate width direction in the narrow active region ACTn in a state of extending in the gate width direction to stride over the narrow active region ACTn. As illustrated in FIG. 35, the gate electrode G2 is formed over the semiconductor layer SL in the narrow active region ACTn via the gate insulating film GOX. The sidewall spacers SW2 are formed also on the side faces of the gate electrode G2 via the offset spacers GOS (see FIG. 33). In addition, the silicide layer SF is formed on/over the upper face of the gate electrode G2 (see FIG. 33).

In addition, as illustrated in FIG. 34, the semiconductor layers (the laminated bodies) SE2 are formed on the both sides of the gate electrode G2 with the gate electrode G2 being interposed in the narrow active region ACTn. As described above, the semiconductor layer SE2 includes the semiconductor layer SL and the epitaxial layer EP2 as illustrated in FIG. 37 and FIG. 38 (the right-side diagrams). As illustrated in FIG. 30, the outer circumference end of the epitaxial layer EPI2 of the semiconductor layer SE2 extends into the depression DB in the element isolation portion STI and overhangs the element isolation portion STI. Further, the outer circumference end of the epitaxial layer EPI2 of the semiconductor layer SE2 is formed in a state of covering also the part of a side surface at the vicinity of the upper corner of the semiconductor layer SL.

A source region SR2 and a drain region DR2 of the field effect transistor Q2 are formed in the semiconductor layers SE2. Thereby, it is possible to achieve the fully depleted transistor by leaving the semiconductor layer SL thin directly under the gate electrode G2 and it is also possible to decrease the respective resistance values of the source region SR2 and the drain region DR2 by thickening the semiconductor layers SL for the source region SR2 and the drain region DR2. Thereby, according to the present embodiment, it is possible to improve the performance of the field effect transistor Q2.

In addition, as illustrated in FIG. 35, the extension regions EX are formed at positions adjacent to the channel sides of the source region SR2 and the drain region DR2 in the semiconductor layer SL under the gate electrode G2 in alignment with the gate electrode G2. In addition, the silicide layers SF are formed on/over the surfaces of the semiconductor layers SE2 in which the source region SR2 and the drain region DR2 are formed respectively.

In addition, as illustrated in FIG. 34, an active region ACTp2 for power supply to the well WL2 of the field effect transistor Q2 is formed at a position separated from the wide active region ACTw. As illustrated in FIG. 35, the silicide layer SF is formed over the upper face of the well WL2 in the active region ACTp2.

The interlayer insulating film IL is deposited on/over the principal surface of the SOI substrate 1S substrate 1S so formed as described above to cover the field effect transistors Q1 and Q2. The plurality of contact holes CNT are formed in the interlayer insulating film IL. The bottom face of each of the contact holes CNT reaches the silicide layer SF. The plugs PLGs, PLGd and PLGp which are made of the conductive materials such as tungsten and so forth are buried in the contact holes CNT in a state of being coupled to the silicide layers SF respectively. In addition, although not illustrated in the drawing, for example, contact holes which reach the silicide layers SF on the upper faces of the gate electrodes G1 and G2 may be formed in the interlayer insulating film IL and plugs for gate electrode extraction are formed in the contact holes in a state of being coupled to the silicide layers SF on the gate electrodes G1 and G2.

In addition, as illustrated in FIG. 35, the drain voltage Vd of, for example, about 0.75 V is applied to the plugs PLGd which are electrically coupled to the drain regions DR1 and DR2 when the semiconductor device is in the standby state. In addition, the source voltage Vs of, for example, 0 V is applied to the plugs PLGs which are electrically coupled to the source regions SR1 and SR2. In addition, the gate voltage Vg of, for example, 0 V is applied to the gate electrodes G1 and G2. Further, the back-gate voltage Vb of, for example, about −1.5 V is applied to the plugs PLGp which are electrically coupled to the wells WL1 and WL2.

Incidentally, although in the present embodiment, a case where one plug PLG is arranged in the wide active region ACTw is exemplified, the present invention is not limited to this case. For example, in a case where the width of the wide active region ACTw is at least 0.50 μm as illustrated in FIG.

8B, the plurality of plugs PLGs and PLGd may be arranged in the wide active region ACTw.

Here, in the semiconductor device according to the present embodiment, as illustrated in the left-side diagram of FIG. 38, the shape of the outer circumference end of the semiconductor layer SE1 which is formed in the wide active region SCTw is formed into the "facet structure" which is almost the same as that of the shape of the outer circumference end of the semiconductor layer SE2 which is formed in the narrow active region ACTn. Here, the outer circumference end of the semiconductor layer SE1 which is formed in the wide active region ACTw corresponds to the both ends in the gate width direction and a one-side end which is separated from the gate electrode G1 in the channel length direction. In addition, the outer circumference end of the semiconductor layer SE2 which is formed in the narrow active region ACTn corresponds to the both ends in the gate width direction and a one-side end which is separated from the gate electrode G2 in the channel length direction.

In addition, in the semiconductor device according to the present embodiment, each of a facet angle θ1 of the outer circumference end of the semiconductor layer SE1 which is formed in the wide active region ACTw and a facet angle θ2 of the outer circumference end of the semiconductor layer SE2 which is formed in the narrow active region ACTn is set to not less than 30° and less than 90°. In this case, the facet angle θ1 of the outer circumference end of the semiconductor layer SE1 is the angle formed between a boundary plane between the semiconductor layer SL and the buried insulating film BOX and an inclined plane of the outer circumference end of the semiconductor layer SE1 (the epitaxial layers EPII and EPI2). In addition, the facet angle θ2 of the semiconductor layer SE2 is the angle formed between the boundary plane between the semiconductor layer SL and the buried insulating film BOX and an inclined plane of the outer circumference end of the semiconductor layer SE2 (the epitaxial layer EPI2).

Further, in the semiconductor device according to the present embodiment, in the semiconductor layer SE1 formed in the wide active region ACTw, a thickness within a range from a boundary between the element isolation portion STI and the semiconductor layer SL on the principal surface of the SOI substrate 1S substrate 1S to 60 nm is set to at least 50% of a thickness of the central part of the semiconductor layer SE1. Likewise, in the semiconductor layer SE2 which is formed in the narrow active region ACTn, the thickness within a range from the boundary between the element isolation portion STI and the semiconductor layer SL to 60 nm is set to at least 50% of a thickness of the central part of the semiconductor layer SE2. However, it is preferable that a thickness of the outer circumference end of each of the semiconductor layers SE1 and SE2 be set to such an extent that it becomes equal to the thickness of the central part of each of the semiconductor layer SE1 and SE2 and each of the semiconductor layers SE1 and SE2 is formed in such a manner that the thickness of the outer circumference end does not exceed the thickness of the central part.

In the present embodiment configured in this way, the thickness of the outer circumference end of the semiconductor layer SE1 in the wide active region ACTw is sufficiently secured similarly to the thickness of the outer circumference end of the semiconductor layer SE2 in the narrow active region ACTn.

Figure 39:
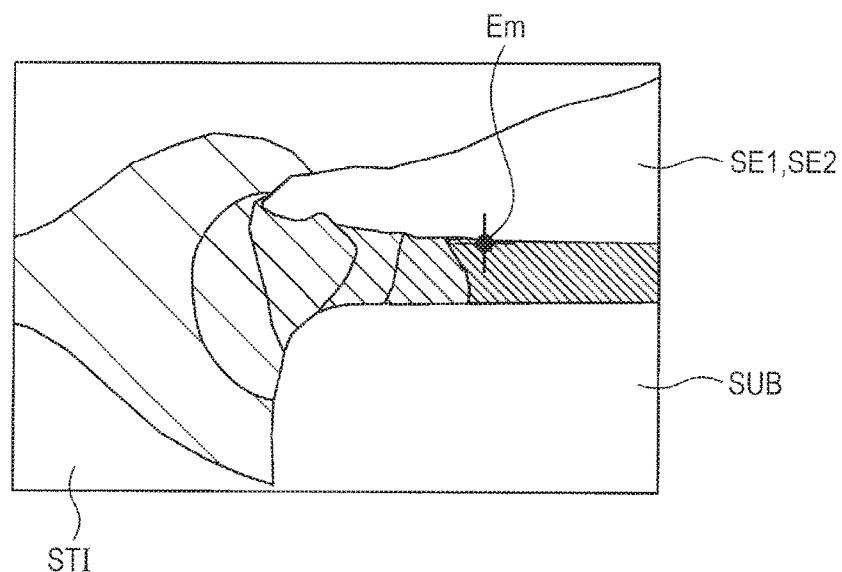
FIG. 39 is a diagram illustrating one example of a result of simulation of an electric field state of a boundary part between an element isolation portion and a semiconductor layer and the vicinity thereof in each of a wide active region and a narrow active region when the semiconductor device according to the present embodiment is in the standby state.

Here, FIG. 39 illustrates a result of simulation of the electric field state of the outer circumference end and its vicinity (the boundary between the element isolation portion and the semiconductor layer and its vicinity) of each of the semiconductor layer SE1 in the wide active region ACTw and the semiconductor layer SE2 in the narrow active region ACTn when the semiconductor device according to the present embodiment is in the standby state. The result of the simulation of the electric field state of the outer circumference end and its vicinity of the semiconductor layer SE1 in the wide active region ACTw is almost the same as the result of the simulation of the electric field state of the outer circumference end and its vicinity of the semiconductor layer SE2 in the narrow active region ACTn. In FIG. 39, Em denotes the electric field maximum point.

It is seen from FIG. 39 that also in the wide active region ACTw, it is possible to prevent the electric field concentration on the outer circumference end of the semiconductor layer SE1 when the semiconductor device is in the standby state similarly to the narrow active region ACTn. Accordingly, it is possible to improve the TDDB lifetime of the buried insulating film BOX of the SOI substrate 1S substrate 1S.

In the foregoing, the present invention which has been made by the inventors concerned is specifically described on the basis of the embodiment of the present invention. However, it goes without saying that the present invention is not limited to the above-described embodiment and various modifications are possible within a range not deviating from the gist of the present invention.

What is claimed is:
1. A method of manufacturing a semiconductor device, comprising the steps of:
(a) forming an isolation portion on a semiconductor layer side of an SOI substrate including a support substrate, a buried insulating film formed on the support substrate and a semiconductor layer formed on the buried insulating film, thereby forming an active region partitioned by the isolation portion in the SOI substrate;
(b) selectively forming a first epitaxial layer on an outer end portion of the semiconductor layer in the active region by performing a first selective epitaxial growth process on the SOI substrate; and
(c) after the step (b), selectively forming a second epitaxial layer over the semiconductor layer in the active region and the first epitaxial layer by performing a second selective epitaxial growth process on the SOI substrate,
wherein the active region includes:
a first active region having a width whose length in a first direction is greater than or equal to a first length, and
a second active region having a width whose length in the first direction is less than the first length,
wherein the first selective epitaxial growth process is performed on the first active region, and
wherein the second selective epitaxial growth process is performed on the first active region and the second active region.
2. The method according to claim 1,
wherein the first selective epitaxial growth process is performed on both ends in the first direction of the semiconductor layer in the first active region.
3. The method according to claim 1, in the step (a), further comprising the steps of:
(a1) forming gate electrodes in the first active region and the second active region after formation of the isolation portion; and
(a2) after the step (a1), forming sidewall spacers on side faces of the gate electrodes, wherein the first direction is a gate width direction of the gate electrode.

4. The method according to claim 3, in the step (b), further comprising the steps of:
   (b1) forming a masking layer through which an outer circumference end of the semiconductor layer in the first active region is partially exposed over the SOI substrate;
   (b2) after the step (b1), performing the first selective epitaxial growth process on the SOI substrate;
   (b3) after the step (b2), removing the masking layer; and
   (b4) after the step (b3), performing the second selective epitaxial growth process on the SOI substrate.

5. The method according to claim 4,
wherein the sidewall spacers are formed by using a silicon nitride film and the masking layer is formed by using a silicon oxide film.

6. The method according to claim 4,
wherein the sidewall spacers are formed by using a silicon oxide film and the masking layer is formed by using a silicon nitride film.

7. The method according to claim 1,
wherein the first length is 250 nm.

8. The method according to claim 1,
wherein the first epitaxial layer is formed over a place separated from an end of the isolation portion within 90 nm.

9. The method according to claim 1,
wherein in the first selective epitaxial growth process and the second selective epitaxial growth process, a gas which contains dichlorosilane, hydrogen chloride and hydrogen is used and a film deposition condition that a pressure is not less than 10 Pa and not more than 1000 Pa and a temperature is not less than 700° C. and not more than 800° C. is used.

10. The method according to claim 1,
wherein in the first selective epitaxial growth process and the second selective epitaxial growth process, a gas which contains silane, chlorine and hydrogen is used and a film deposition condition that a pressure is not less than 10 Pa and not more than 1000 Pa and a temperature is not less than 500° C. and not more than 700° C. is used.

* * * * *